United States Patent
Yamashita et al.

(10) Patent No.: US 6,320,630 B1
(45) Date of Patent: Nov. 20, 2001

(54) LIQUID CRYSTAL DISPLAY DEVICE HAVING A SLIM DRIVER CHIP

(75) Inventors: Yuji Yamashita; Mitsuru Goto, both of Chiba; Masanari Saito, Mobara; Shinji Yasukawa, Shirako; Akira Ogura, Nagara; Kentaro Agata, Mobara, all of (JP)

(73) Assignees: Hitachi, Ltd., Tokyo; Hitachi Device Engineering Co., Ltd., Chiba-ken, both of (JP)

( * ) Notice: Subject to any disclaimer, the term of this patent is extended or adjusted under 35 U.S.C. 154(b) by 0 days.

(21) Appl. No.: 09/493,073

(22) Filed: Jan. 28, 2000

(30) Foreign Application Priority Data

Feb. 25, 1999  (JP) .................................................. 11-047885

(51) Int. Cl.$^7$ ..................................................... G02F 1/136
(52) U.S. Cl. ............................................. 349/42; 349/42

(58) Field of Search ................................. 349/50, 52, 149, 349/152; 430/315; 373/498

(56) References Cited

U.S. PATENT DOCUMENTS

| 4,952,984 | * | 8/1990 | Martens et al. ........................ 349/50 |
| 5,545,589 | * | 8/1996 | Martens et al. ........................ 349/50 |
| 5,811,929 | * | 9/1998 | Potter ................................... 313/498 |
| 6,083,666 | * | 7/2000 | Kim ..................................... 430/315 |

* cited by examiner

Primary Examiner—William L. Sikes
Assistant Examiner—Julie Ngo
(74) Attorney, Agent, or Firm—Reed Smith Hazel & Thomas LLP

(57) ABSTRACT

A liquid crystal display device in which bump electrodes of a semiconductor chip included in a video signal line driving circuit are disposed over noise-absorbing protective diodes so that the area occupied by the semiconductor chip is decreased to reduce the size of the video signal line driving circuit.

14 Claims, 16 Drawing Sheets

FIG. 12
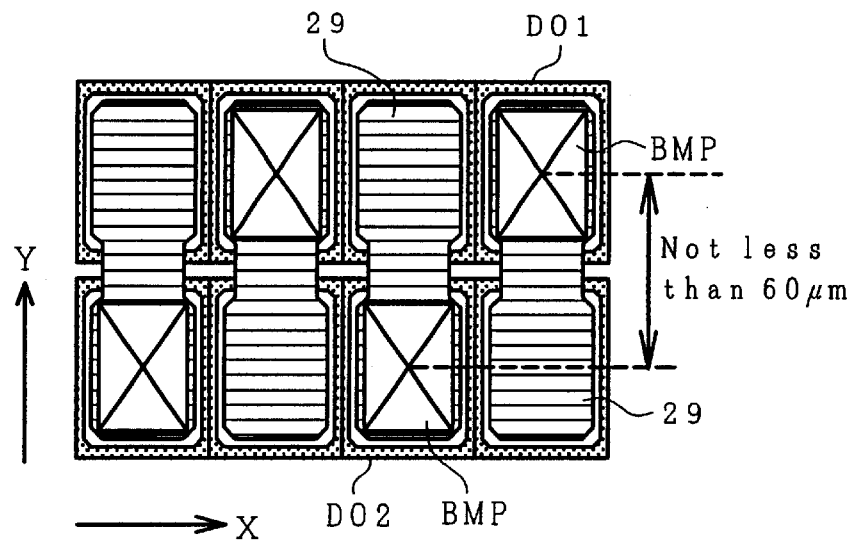
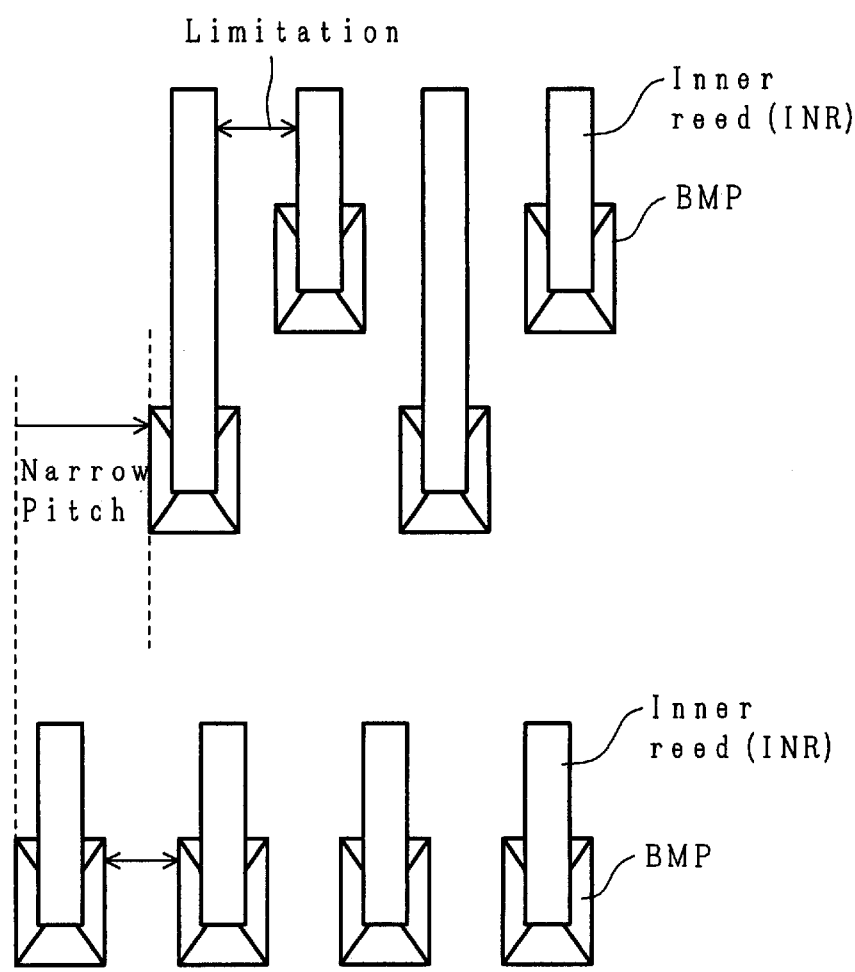

LIQUID CRYSTAL DISPLAY DEVICE HAVING A SLIM DRIVER CHIP

BACKGROUND OF THE INVENTION

1. Field of the Invention

The present invention relates to a liquid crystal display device and, more particularly, to an art useful in application to a video signal line driving unit (drain driver) of a liquid crystal display device capable of providing multilevel grayscale display.

2. Description of the Related Art

Active matrix liquid crystal display devices which have active elements (for example, thin-film transistors) for individual pixels and drive the active elements in a switching manner are widely used as display devices for notebook personal computers.

In such an active matrix liquid crystal display device, since video signal voltages (grayscale voltages corresponding to individual display data; hereinafter referred to simply as grayscale voltage(s)) to its pixel electrodes via the respective active elements, no crosstalk occurs between the pixels, and unlike a simple matrix liquid crystal display device, multilevel grayscale display can be provided without the need to use a special driving method for preventing crosstalk.

A TFT type of liquid crystal display module is known as one kind of active matrix liquid crystal display device. The TFT type of liquid crystal display module includes a TFT (Thin Film Transistor) type of liquid crystal display panel (TFT-LCD), a drain driver arranged on the top side of the liquid crystal display panel, and a gate driver and an interface block each of which is arranged on any of the sides of the liquid crystal display panel.

The drain driver included in the TFT type of liquid crystal display module is made of one semiconductor chip, and the semiconductor chip has in its inside a multilevel grayscale voltage generation circuit and a multilevel grayscale voltage selection circuit for selecting one grayscale voltage level corresponding to display data, from the multilevel grayscale voltage generated by the multilevel grayscale voltage generation circuit.

This art is disclosed in, for example, Japanese Patent Application Nos. 86668/1996 and 50699/1998.

SUMMARY OF THE INVENTION

In recent years, the trend in liquid crystal display devices such as a TFT type of liquid crystal display module has been toward larger screen sizes in liquid crystal display panels, higher resolution (a larger number of pixels) and higher image quality. In addition, in order to omit a useless space from the interior of a liquid crystal display device and improve the appearance thereof, it has been demanded that the area other than the display area of the liquid crystal display device, i.e., a frame portion, be made as small as possible (the width of the frame portion be made narrow).

Moreover, to promote far wider use of liquid crystal display devices, it has been strongly demanded to decrease the prices of liquid crystal display devices.

For this reason, it has been necessary to increase the number of output pins of a semiconductor chip which constitutes a drain driver (hereinafter referred to simply as a semiconductor chip) and make the area of the semiconductor chip far smaller, i.e., enlarge the scale of integration of the semiconductor chip.

The semiconductor chip has, on the other hand, a plurality of bump electrodes to be connected to the inner leads of a tape carrier package, and protective diode pairs each of which is disposed for the corresponding one of the bump electrodes to protect its internal circuits from noise which enters from outside the semiconductor chip.

In general, each of the protective diode pairs is disposed in the vicinity of the corresponding one of the bump electrodes because it is necessary to electrically connect each of the protective diode pairs to the corresponding one of the bump electrodes.

However, the bump electrodes need to be spaced apart from one another to some extent because it is necessary to prevent an accident such as a short circuit between adjacent bump electrodes.

Moreover, a region in which each of the protective diode pairs is formed needs to have enough area to absorb noise.

For these reasons, there has been the problem that it is impossible to increase the number of output pins of a semiconductor chip and decrease the area thereof, with the result that it is impossible to meet demands such as narrower frame portions in liquid crystal display devices or reductions in the prices thereof.

The invention has been made to solve the problems of the related art, and an object of the invention is to provide an art which is capable of reducing, in a liquid crystal display device, the area occupied by the bump electrodes and the protective diode pairs of a semiconductor chip in a video signal line driving circuit unit, thereby reducing the chip size of the semiconductor chip.

Another object of the invention is to provide an art which is capable of realizing a liquid crystal display device having a far narrower frame portion and a far lower price.

The above and other objects as well as novel advantages of the invention will become apparent from the following description, taken in conjunction with the accompanying drawings.

Representative aspects of the invention disclosed in the present application will be described below in brief.

The invention provides a liquid crystal display device which comprises: a liquid crystal display element having a plurality of pixels arranged in matrix form; and a video signal line driving unit for supplying a video signal voltage to each of the pixels, the video signal line driving unit including at least one semiconductor chip, the at least one semiconductor chip including: a plurality of bump electrodes; a plurality of protective diode pairs each including a first diode and a second diode; and a plurality of interconnect layers disposed to cover an anode region of the first diode and a cathode region of the second diode of each of the protective diode pairs and connected to the anode region of the first diode and the cathode region of the second diode, the plurality of interconnect layers having connection portions for connection to the respective bump electrodes, each of the interconnect layers which overlie the anode region of the first diode and the cathode region of the second diode of each of the protective diode pairs having the same shape, at least one of the plurality of bump electrodes being disposed over the anode region of the first diode or the cathode region of the second diode of one of the protective diode pairs and being connected to a corresponding one of the connection portions of the interconnect layers over the anode region of the first diode or the cathode region of the second diode of the one of the protective diode pairs.

The invention also provides a liquid crystal display device which comprises: a liquid crystal display element having a plurality of pixels arranged in matrix form; and a video signal line driving unit for supplying a video signal voltage to each of the pixels, the video signal line driving unit including at least one semiconductor chip, the at least one semiconductor chip including: a plurality of bump electrodes; a plurality of protective diode pairs each including a first diode and a second diode; and a plurality of interconnect layers disposed to cover an anode region of the first diode and a cathode region of the second diode of each of the protective diode pairs and connected to the anode region of the first diode and the cathode region of the second diode, the plurality of interconnect layers having connection portions for connection to the respective bump electrodes, each of the interconnect layers which overlie the anode region of the first diode and the cathode region of the second diode of each of the protective diode pairs being formed to be wider than the anode region of the first diode and the cathode region of the second diode; at least one of the plurality of bump electrodes being disposed over the anode region of the first diode or the cathode region of the second diode of one of the protective diode pairs and being connected to a corresponding one of the connection portions of the interconnect layers over the anode region of the first diode or the cathode region of the second diode of the one of the protective diode pairs.

The invention also provides a liquid crystal display device which further comprises an insulation layer which is formed over the interconnect layers and has an opening over the anode region of the first diode or the cathode region of the second diode of each of the protective diode pairs, at least one of the plurality of bump electrodes being formed over the opening and the insulation layer in a peripheral portion of the opening and being connected to the corresponding one of the connection portions of the interconnect layers by the opening.

The invention also provides a liquid crystal display in which one of two adjacent bump electrodes of the plurality of bump electrodes is disposed over the anode region of the first diode (or the cathode region of the second diode) of each of the protective diode pairs, and the other is disposed over the cathode region of the second diode (or the anode region of the first diode) of each of the protective diode pairs.

The invention also provides a liquid crystal display device which further comprises a conductive layer which is disposed between the interconnect layers and the anode region of the first diode and the cathode region of the second diode of each of the protective diode pairs in such a manner that interlayer insulation layers are interposed both between the conductive layer and the anode and cathode regions and between the conductive layer and the interconnect layers, the conductive layer being connected to the anode region of the first diode and the cathode region of the second diode by a plurality of first connection holes formed in the interlayer insulation layer in a first area over the anode region of the first diode and the cathode region of the second diode of each of the protective diode pairs, the conductive layer being also connected to the interconnect layers by a plurality of second connection holes formed in the interlayer insulation layer outside the first area over the anode region of the first diode and the cathode region of the second diode of each of the protective diode pairs.

BRIEF DESCRIPTION OF THE DRAWINGS

FIG. 5($b$) is a cross-sectional view showing the construction of one of the tape carrier packages (TCPs) shown in FIG. 4;

FIG. 12 is a view showing the state of connection between the inner leads INR of one of the tape carrier packages (TCPs) and the semiconductor chip (IC) according to the embodiment;

FIG. 13($b$) is a cross-sectional view showing the construction of the chip-on-film (COF) structure;

DESCRIPTION OF THE PREFERRED EMBODIMENT

Figure 1:
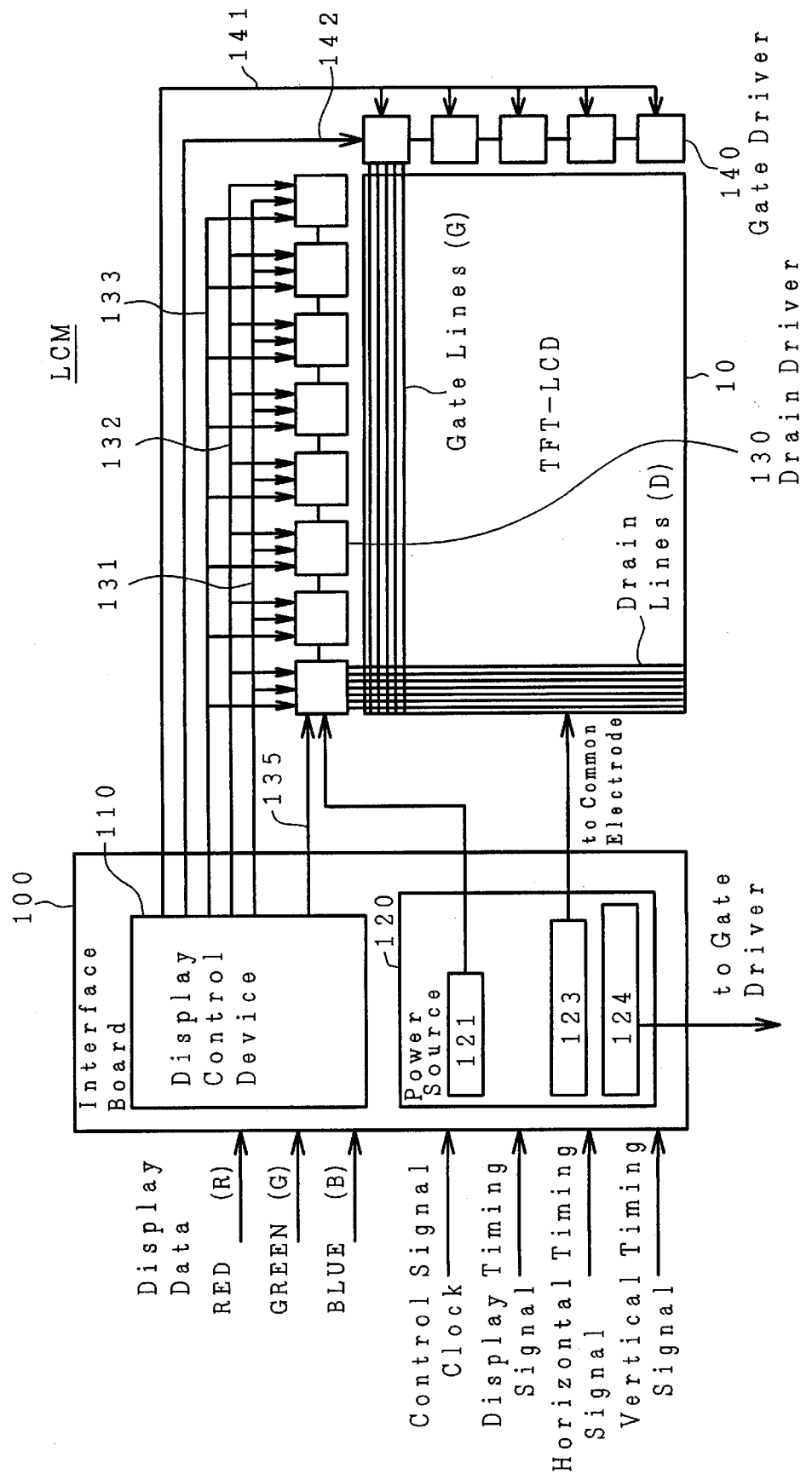
FIG. 1 is a block diagram schematically showing the construction of a TFT type of liquid crystal display module according to an embodiment of the invention.

A preferred embodiment of the invention will be described below in detail with reference to the accompanying drawings.

Throughout all the drawings that illustrate the embodiments, identical reference numerals are used to denote constituent elements having identical functions, and the repetition of the same description is omitted.

FIG. 1 is a block diagram schematically showing the construction of a TFT type of liquid crystal display module according to an embodiment of the invention.

In a liquid crystal display module LCM according to the embodiment of the invention, drain drivers 130 are arranged on the top side of a liquid crystal display panel (a liquid crystal display element according to the invention; TFT-LCD) 10, and gate drivers 140 are arranged on one lateral side of the liquid crystal display panel 10, while an interface block 100 is arranged on the opposite lateral side of the same.

The interface block 100 is mounted on an interface board, and the drain drivers 130 and the gate drivers 140 are respectively mounted on predetermined tape carrier packages (TCPs).

Figure 2:
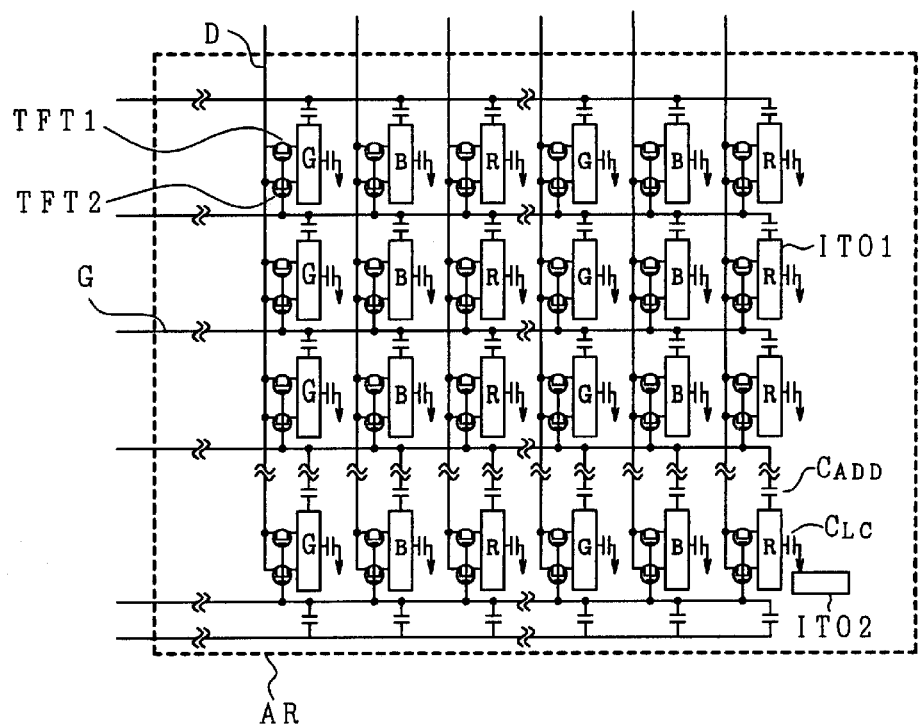
FIG. 2 is a view showing the equivalent circuit of one example of the liquid crystal display panel shown in FIG. 1.

FIG. 2 is a view showing the equivalent circuit of one example of the liquid crystal display panel 10 shown in FIG. 1.

As shown in FIG. 2, the liquid crystal display panel 10 has a plurality of pixels (1024 ⋺ 3 ⋺ 768 pixels) formed in matrix.

Each of the pixel is arranged in the area of intersection of two adjacent signal lines (drain signal lines D or gate signal lines G) and two adjacent signal lines (gate signal lines G or drain signal lines D).

Each of the pixels has thin-film transistors TFT1 and TFT2 and the source electrodes of the thin-film transistors TFF1 and TFT2 are connected to a pixel electrode Since a liquid crystal layer is disposed between the pixel electrode ITO1 and a common electrode ITO2, a liquid crystal capacitance CLC is equivalently connected between the pixel electrode ITO1 and the common electrode ITO2.

An additional capacitance CADD is connected between the source electrode of one (TFT1) of the thin-film transistors TFT1 and TFT2 and the front-stage one of the two adjacent gate signal lines G.

Figure 3:
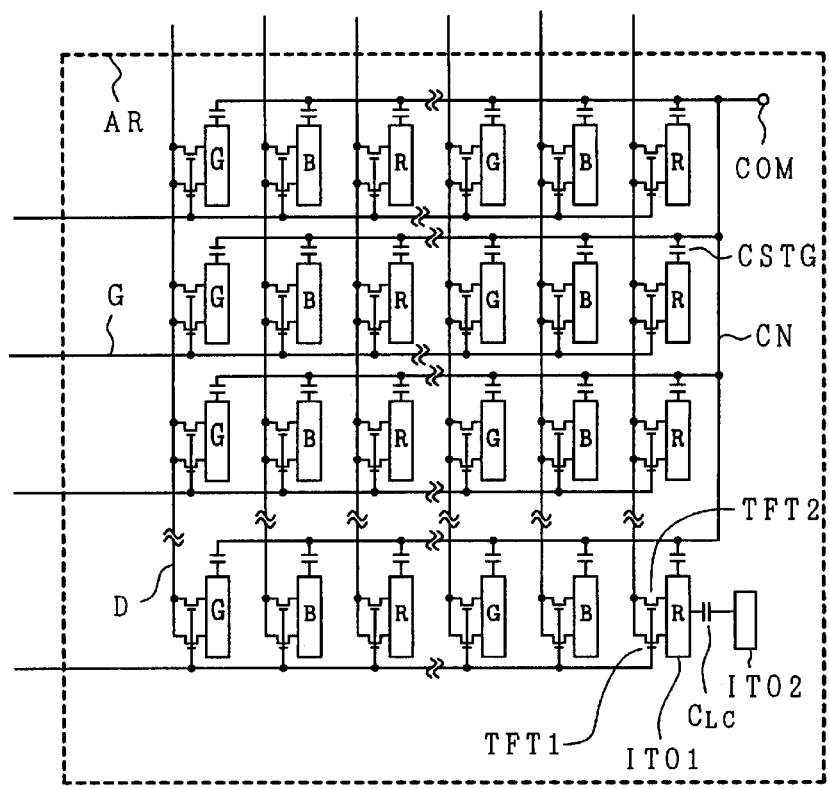
FIG. 3 is a view showing the equivalent circuit of another example of the liquid crystal display panel shown in FIG. 1.

FIG. 3 is a view showing the equivalent circuit of another example of the liquid crystal display panel 10 shown in FIG. 1.

In the example shown in FIG. 2, the additional capacitance CADD is formed between the front-stage gate signal line G and the source electrode, whereas in the equivalent circuit of the example shown in FIG. 3 a storage capacitance CSTG is formed between a common signal line COM and the source electrode.

The invention can be applied to either of the examples. In the former example, a pulse on the front-stage gate signal line G may penetrate into the pixel electrode ITO1 through the additional capacitance CADD, but in the latter example, since such penetration does not occur, a far better display is enabled.

In each of FIGS. 2 and 3, symbol AR denotes a display area, and each of FIGS. 2 and 3 is a circuit diagram which is drawn to correspond to an actual geometric arrangement.

In the liquid crystal display panel 10 shown in each of FIGS. 2 and 3, the drain electrodes of each of the thin-film transistors (TFTs) of each of the pixels which are arranged in columns are connected to the adjacent one of the drain signal lines D, and each of the drain signal lines D is connected to the corresponding one of the drain drivers 130 for supplying grayscale voltages to the liquid crystal in the corresponding ones of the pixels arranged in columns.

The gate electrodes of the thin-film transistors (TFTs) of each of the pixels which are arranged in rows are connected to the adjacent one of the gate signal lines G, and each of the gate signal lines G is connected to the corresponding one of the gate drivers 140 for supplying, for each horizontal scanning period, scanning driving voltages (positive bias voltages or negative bias voltages) to the gate electrodes of the thin-film transistors (TFTs) of the corresponding ones of the pixels arranged in rows.

The interface block 100 shown in FIG. 1 includes a display control device 110 and a power source circuit 120.

The display control device 110 is made of one semiconductor integrated circuit (LSI), and controls and drives the drain drivers 130 and the gate drivers 140 on the basis of display control signals such as clock signals, display timing signals, horizontal synchronizing signals and vertical synchronizing signals as well as display data (R, G and B) all of which are transmitted from the body of a computer.

When the display control device 110 receives a display timing signal, the display control device 110 determines that a display start position has been received, and outputs a start pulse (a display data acceptance start signal) to the first one of the drain drivers 130 via a signal line 135, and also outputs a single line of received display data to the drain drivers 130 via a bus line 133 for display data.

At this time, the display control device 110 outputs via a signal line 131 a display data latching clock CL2 (hereinafter referred to simply as the clock CL2) which is a display control signal for latching display data into the data latch circuit of each of the drain drivers 130.

The display data transmitted from the body of the computer is 6-bit data, and is transmitted by one pixel at a time, i.e., one set of red (R), green (G) and blue (B) data at a time, at intervals of a unit time period.

When the input of the display timing signal is completed or a predetermined time period passes after the display timing signal has been inputted, the display control device 110 determines that one horizontal line of display data has reached its end, and outputs, to each of the drain drivers 130 via a signal line 132, an output timing control clock CL1 (hereinafter referred to simply as the clock CL1) which is a display control signal for outputting the display data stored in the data latch circuit of each of the drain drivers 130 to the drain signal lines D of the liquid crystal display panel 10.

When the first display timing signal is inputted to the display control device 110 after the input of a vertical synchronizing signal, the display control device 110 determines that the first display line has been received, and outputs a frame start signal to the corresponding one of the gate drivers 140 via a signal line 142.

In addition, the display control device 110 outputs a clock CL3 which is a shift clock having a cycle of one horizontal scanning period, to the gate drivers 140 via a signal line 141 so that a positive bias voltage is sequentially applied to each of the gate signal lines G of the liquid crystal display panel 10 at intervals of one horizontal scanning time on the basis of a horizontal synchronizing signal.

In this manner, a plurality of thin-film transistors (TFTs) connected to each of the gate signal lines G of the liquid crystal display panel 10 are turned on for one horizontal synchronizing time.

By the above-described operation, an image is displayed on the liquid crystal display panel 10.

The power source circuit 120 shown in FIG. 1 is made of a voltage generation circuit 121, a common electrode (counter electrode) voltage generation circuit 123 and a gate electrode voltage generation circuit 124.

The voltage generation circuit 121 is made of a series resistance voltage dividing circuit, and outputs and supplies a nine-level grayscale reference voltage (V0 to V8) to each of the drain drivers 130.

In addition, an alternation signal (alternation timing signal; M) from the display control device 110 is supplied to each of the drain drivers 130 via the signal line 135.

The common electrode voltage generation circuit 123 generates a driving voltage to be applied to the common electrode ITO2, while the gate electrode voltage generation circuit 124 generates a driving voltage (a positive bias voltage or a negative bias voltage) to be applied to the gate electrodes of the thin-film transistors (TFTns).

Figure 4:
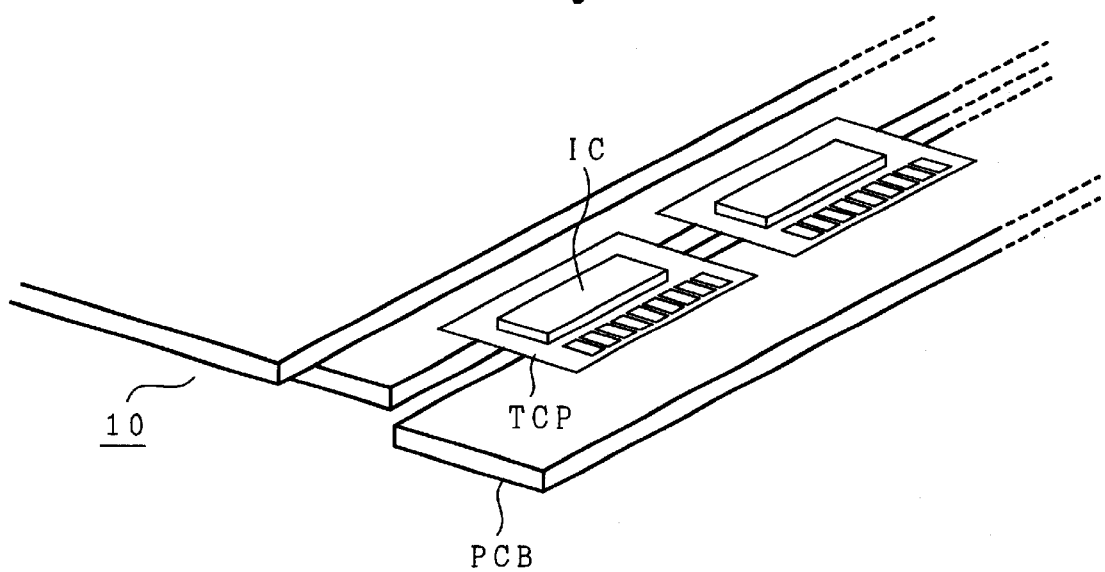
FIG. 4 is a perspective view showing the state of arrangement of drain drivers which are arranged along an edge of the liquid crystal display panel.

FIG. 4 is a perspective view showing the state of arrangement of the drain drivers 130 which are arranged along an edge of the liquid crystal display panel 10.

As shown in FIG. 4, a driving circuit board PCB is mounted along the edge of the liquid crystal display panel 10 on one side thereof.

Electronic components such as tape carrier packages (TCPs) and capacitors are mounted on the driving circuit board PCB, and semiconductor chips which constitute the respective drain drivers 130 (hereinafter referred to simply as semiconductor chips) (ICs) are mounted on the tape carrier packages (TCPs), respectively.

Figure 5:
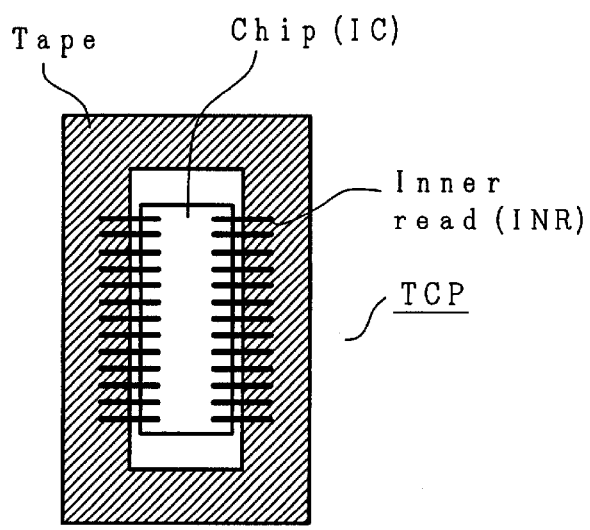
FIG. 5($a$) is a plan view schematically showing the construction of one of the tape carrier packages (TCPs) shown in FIG. 4.
Figure 5:
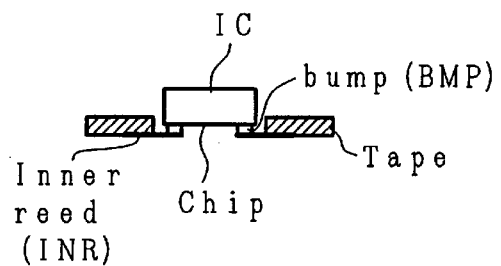

FIGS. 5(a) and 5(b) are views schematically showing the construction of one of the tape carrier packages (TCPs) shown in FIG. 4. FIG. 5(a) is a plan view, and FIG. 5(b) is a cross-sectional view showing the essential portion of the tape carrier package (TCP) shown in FIG. 5(a).

As shown in FIGS. 5(a) and 5(b), inner leads INR of the tape carrier package (TCP) are electrically and mechanically connected to bump electrodes BMP of the semiconductor chip (IC), respectively.

Figure 6:
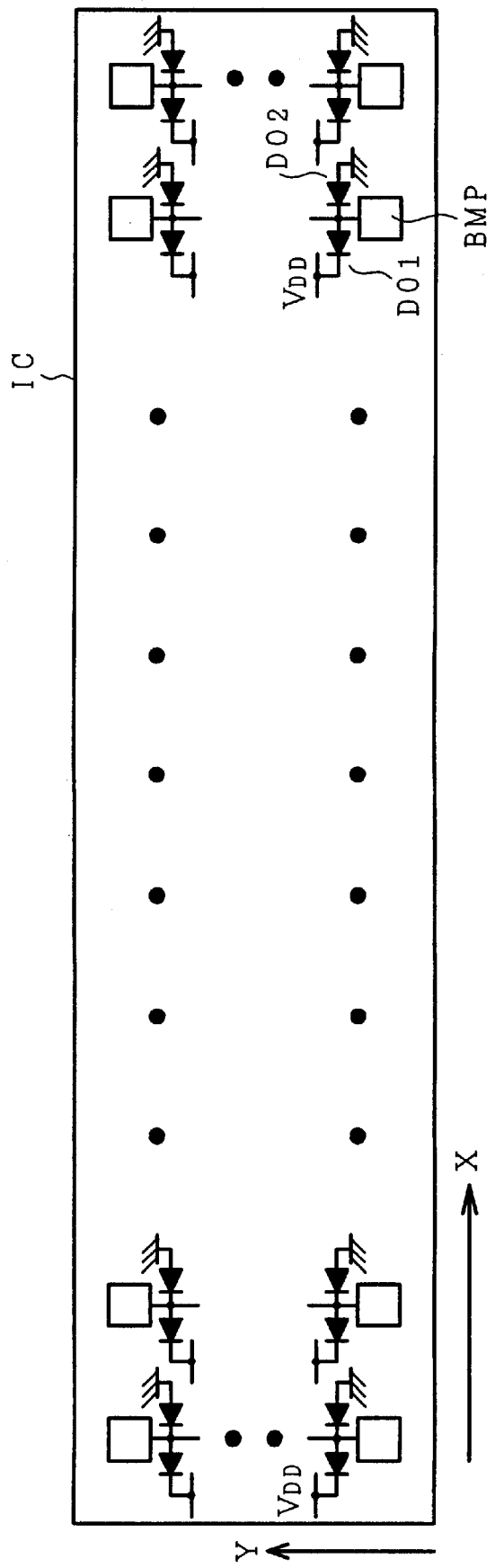
FIG. 6 is a view showing the arrangement of bump electrodes BMP in a semiconductor chip (IC) of the embodiment.

FIG. 6 is a view showing the arrangement of the bump electrodes BMP in the semiconductor chip (IC) of the embodiment.

As shown in FIG. 6, a plurality of bump electrodes BMP are formed in the edge portions of the semiconductor chip (IC).

These bump electrodes BMP are divided into input-side bump electrodes (for example, about 50 bump electrodes) and output-side bump electrodes (for example, about 384 bump electrodes) to be connected to the corresponding ones of the drain signal lines D.

As shown in FIG. 6, a pair of protective diodes DO1 and DO2 for protecting the inner circuit of the semiconductor chip (IC) from noise which enters the semiconductor chip (IC) from outside are connected to each of the bump electrodes BMP.

The protective diode DO1 for absorbing positive noise has a cathode electrode connected to a power source potential (a first reference potential) and an anode electrode electrically connected to the corresponding one of the bump electrodes BMP.

The protective diode DO2 for absorbing negative noise has a cathode electrode connected to the corresponding one of the bump electrodes BMP and an anode electrode electrically connected to a ground potential (a second reference potential).

Needless to say, in the construction shown in FIG. 6, the pairs of protective diodes DO1 and DO2 are formed in the interior of the semiconductor chip (IC).

Figure 7:
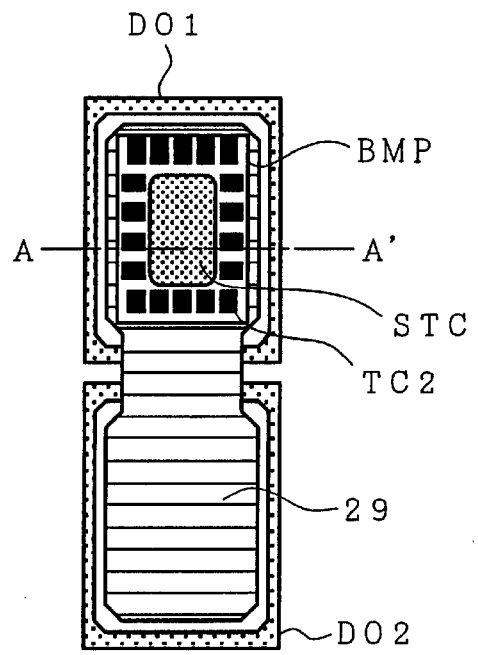
FIG. 7 is a view showing the relationship between one of the bump electrodes BMP of the semiconductor chip (IC) of the embodiment and an area in which the elements of a pair of probes DO1 and DO2 are formed.

FIG. 7 is a view showing the relationship between one of the bump electrodes BMP of the semiconductor chip (IC) of the embodiment and an area in which the elements of a pair of protective diodes DO1 and DO2 are formed.

Figure 8:
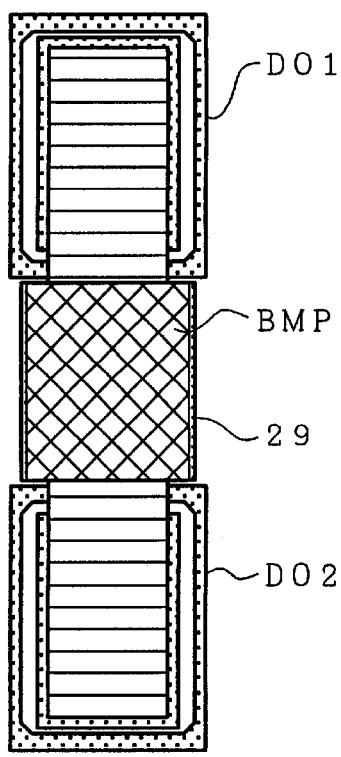
FIG. 8 is a view showing the relationship between one bump electrodes BMP of a related-art semiconductor chip (IC) and an area in which the elements of a pair of protective diodes DO1 and DO2 are formed.

FIG. 8 is a view showing the relationship between one bump electrodes BMP of a related-art semiconductor chip (IC) and an area in which the elements of a pair of protective diodes DO1 and DO2 are formed.

In the related-art semiconductor chip (IC), the area in which the elements of the pair of protective diodes DO1 and DO2 are formed is disposed in the vicinity of the bump electrode BMP.

In contrast, in the embodiment, the bump electrode BMP which uses, for example, gold as its material is formed in the area in which the elements of the pair of protective diodes DO1 and DO2 are formed.

Accordingly, in the embodiment, the length of the semiconductor chip (IC) can be reduced in the breadth wise direction thereof (the Y direction as viewed in FIG. 6).

Figure 9:
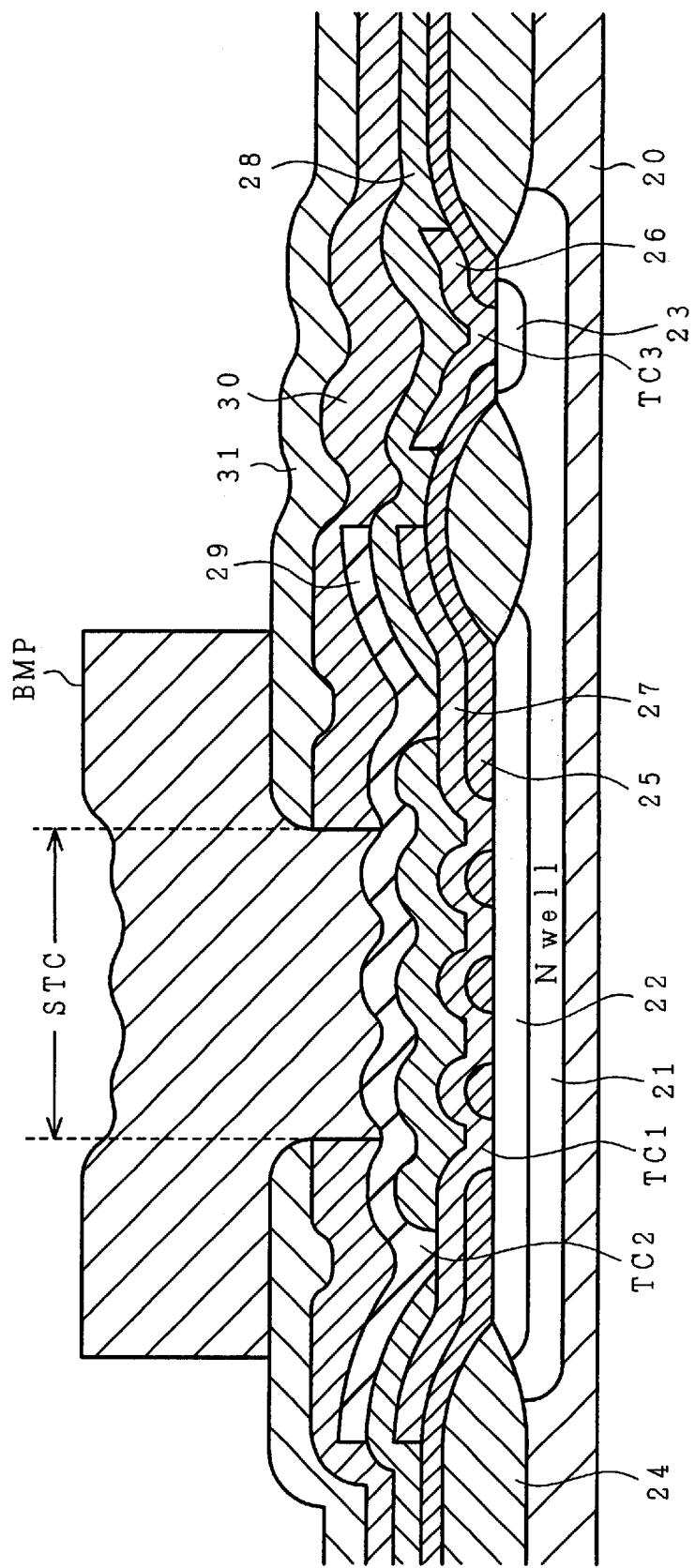
FIG. 9 is a cross-sectional view showing the cross-sectional structure taken along line A–A' of FIG. 7.

FIG. 9 is a cross-sectional view showing the cross-sectional structure taken along line A–A' of FIG. 7.

In FIG. 9, reference numeral 20 denotes a p-type substrate. An n-well region (a cathode region) 21 is formed in the p-type substrate 20, and a p-type semiconductor region (an anode region) 22 and an n-well power supply region 23 are formed in the n-well region 21.

The p-type semiconductor region 22 and the n-well region 21 constitute the diode DO1.

Reference numeral 24 denotes a field insulation layer (LOCOS). A first interlayer insulation layer 25 is formed over the field insulation layer 24, and a first metal layer (conductive layer) 26 and a second metal layer 27 are formed over the first interlayer insulation layer 25.

The first metal layer 26 is electrically connected to the n-well power supply region 23 by a plurality of connection holes TC3 formed in the first interlayer insulation layer 25, and the first metal layer 26 is connected to a power source line for supplying a power source potential VDD.

The second metal layer 27 is electrically connected to the p-type semiconductor region 22 by a plurality of first connection holes TC1 formed in the first interlayer insulation layer 25.

A second interlayer insulation layer 28 is formed over the first and second metal layers 26 and 27, and an interconnection layer 29 is formed over the second interlayer insulation layer 28.

The interconnect layer 29 is connected to the second metal layer 27 by a plurality of second connection holes TC2 formed in the second interlayer insulation layer 28.

The second connection holes TC2 are disposed in an area outside the area in which the first connection holes TC1 are formed.

A third interlayer insulation layer 30 and a protective layer 31 are formed over the interconnect layer 29.

The thin-coverage portions of the interconnect layer 29 in which the second connection holes TC2 are formed can be protected by the third interlayer insulation layer 30 and the protective layer 31.

An opening STC is formed to extend through the third interlayer insulation layer 30 and the protective layer 31, and the bump electrode BMP and the interconnect layer 29 are electrically connected to each other via the opening STC.

The second connection holes TC2 are disposed below the bump electrode BMP.

The interconnect layer 29 is extended into the semiconductor chip (IC).

The second protective diode DO2 is made of a p-well region, an n-type semiconductor region and a p-type power supply region in place of the n-well region 21, the p-type semiconductor region 22 and the n-well power supply region 23.

However, in the second protective diode DO2, the first metal layer 26 is connected to a ground line for supplying a ground potential GND.

In this manner, in the semiconductor chip (IC) according to the embodiment, the bump electrode BMP is disposed in the opening STC as well as over the portion of the protective layer 31 which surrounds the opening STC, above the anode region of the first protective diode DO1, and the plurality of second connection holes TC2 are formed below the bump electrode BMP. Accordingly, since it is not necessary to independently provide an area in which the plurality of second connection holes TC2 are to be formed, it is possible to increase the size of the bump electrode BMP and reduce the chip size of the semiconductor chip (IC).

In general, to meet a demand for increased image quality in liquid crystal display panels, it is required to decrease the connection resistance values between the video signal lines D and the drain drivers 130. In the semiconductor chip (IC) according to the embodiment, since the size of each of the bump electrodes BMP can be increased, the connection resistance values between the video signal lines D and the drain drivers 130 can be decreased.

Moreover, since the plurality of second connection holes TC2 each made from a small connection hole (with a diameter of, for example, about 2$\mu$ m) are dispersedly arranged, the flatness of the surface of the bump electrode BMP can be increased.

In the case of forming the respective bump electrodes BMP above the areas in each of which the elements of the first diode DO1 are formed (i.e., the anode regions), it is impossible to apply an excessive pressure during the thermocompression bonding of the inner leads INR of the tape carrier packages (TCP) to the bump electrodes BMP. Therefore, if the flatness of the surface of any of the bump electrodes BMP is inferior, a defective adhesion occurs between the bump electrode BMP of inferior flatness and the corresponding inner lead INR.

However, in the semiconductor chip (IC) according to the embodiment, since the flatness of the surface of each of the bump electrodes BMP can be improved (or the area of contact between each of the bump electrodes BMP and the corresponding one of the inner leads INR can be increased), it is possible to prevent a defective adhesion from occurring between the bump electrodes BMP and the inner leads INR.

In addition, since the first and second diodes DO1 and DO2 are given the same area and shape, the opening STC can be disposed above either of the first and second diodes DO1 or DO2.

In other words, in the semiconductor chip (IC) according to the embodiment, the bump electrode BMP can be disposed above either of the first and second diodes DO1 or DO2.

Figure 10:
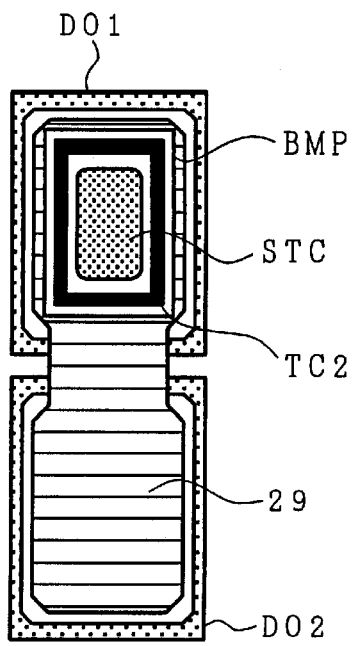
FIG. 10 is a view showing a modification of the semiconductor chip (IC) according to the embodiment.

FIG. 10 is a view showing a modification of the semiconductor chip (IC) according to the embodiment.

The semiconductor chip (IC) shown in FIG. 10 differs from the semiconductor chip (IC) shown in FIG. 7 in that the second connection hole TC2 are formed in the shape of a slit.

The structure shown in FIG. 10 can also provide advantages similar to the above-described ones.

Figure 11:
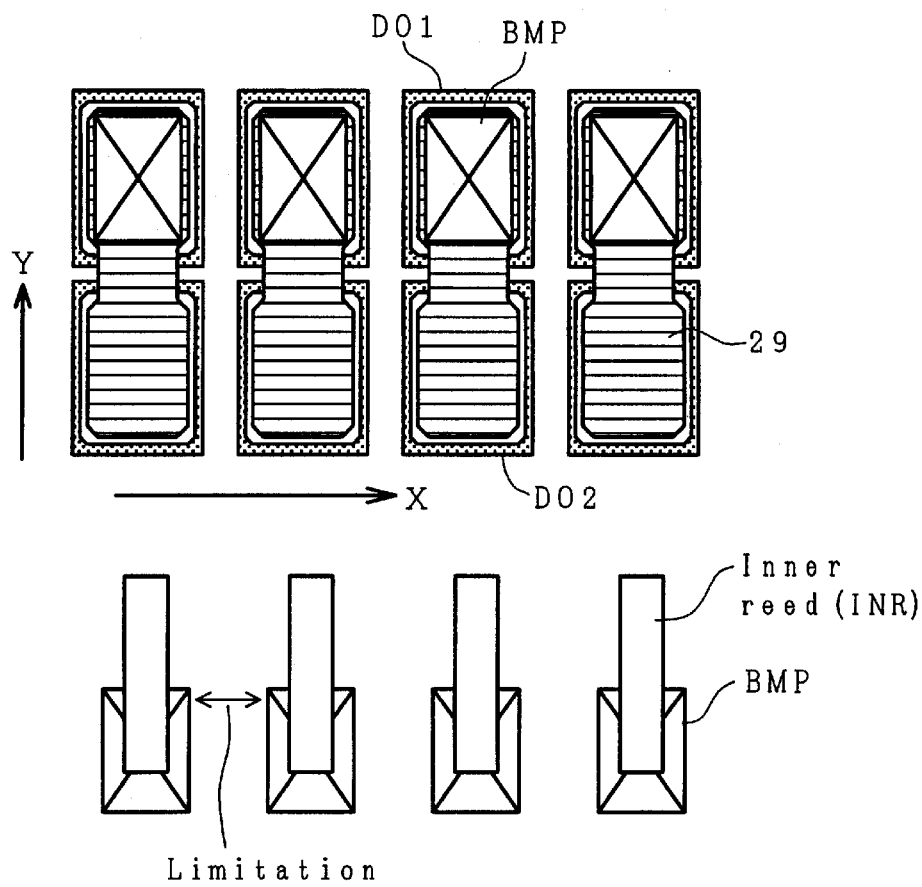
FIG. 11 is a view showing the state of connection between the inner leads INR of one of the tape carrier packages (TCPs) and the semiconductor chip (IC) according to the embodiment.

FIGS. 11 and 12 are views showing the state of connection between the inner leads INR of one of the tape carrier packages (TCPs) and the semiconductor chip (IC) according to the embodiment.

In case that the respective bump electrodes BMP are arranged over the first diodes DO1 as shown in FIG. 11, the length of the semiconductor chip (IC) in the breadth wise direction thereof (the Y direction as viewed in FIG. 11) can be made shorter than that of the related-art semiconductor chip (IC) as described previously.

However, since there is a predetermined limitation on the distance between each of the bump electrodes BMP and the adjacent one because a short circuit between the adjacent bump electrodes BMP needs to be prevented, the length of the semiconductor chip (IC) in the longitudinal direction thereof (the X direction as viewed in FIG. 11) cannot be made very short.

On the other hand, in case that the bump electrodes BMP are arranged in a staggered manner as shown in FIG. 12, by setting the distance between each of the staggered bump electrodes BMP and the adjacent one to about 60$\mu$ m or more, it is possible to make the distance between the protective diodes DO1 and DO2 short (narrow in pitch) to a distance which is determined by the strength of the inner leads INR or working limitations on the inner leads INR. Therefore, it is possible to make the length of the semiconductor chip (IC) in the longitudinal direction (the X direction as viewed in FIG. 12) shorter than that in the related art.

Although the embodiment has been described with reference to a case in which the invention is applied to tape carrier packages (TCPs), it goes without saying that the invention is not limited to only such a case and can also be applied to the chip-on-film (COF) structure shown in FIGS. 13(a) and 13(b).

Figure 13:
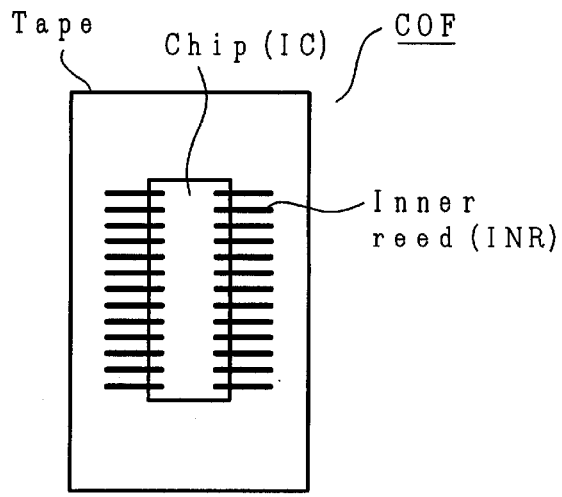
FIG. 13($a$) is a plan view schematically showing the construction of a chip-on-film (COF) structure.
Figure 13:
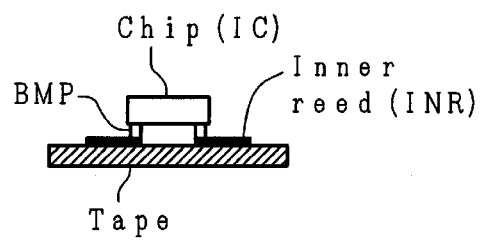

Incidentally, FIGS. 13(a) and 13B are views schematically showing the construction of the chip-on-film (COF) structure, and FIG. 13(a) is a plan view of the chip-on-film (COF) structure, while FIG. 13(b) is a cross-sectional view showing the essential portion of the same.

Figure 14:
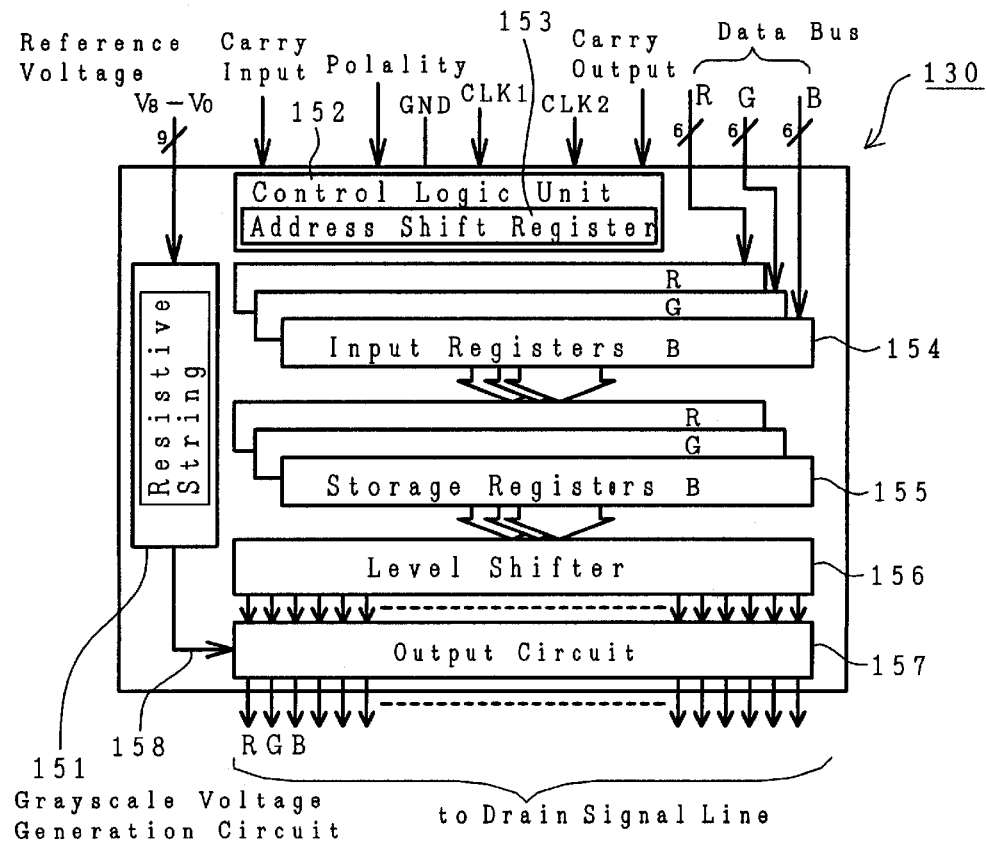
FIG. 14 is a block diagram schematically showing one example of the construction of the drain driver,shown in FIG. 1.

FIG. 14 is a block diagram schematically showing one example of the construction of each of the drain drivers 130 shown in FIG. 1.

Each of the drain drivers 130 is made of one semiconductor integrated circuit (LSI).

In FIG. 14, a grayscale voltage generation circuit 151 is made of a series resistance voltage dividing circuit, and divides into eight voltage levels each of the voltage ranges between adjacent grayscale voltages (for example, the voltage range between V0 and V1, the voltage range between V1 and V2) in the nine-level grayscale reference voltage (V0 to V8) which are inputted from the voltage generation circuit 121, thereby generating a 64-level grayscale voltage and outputting the 64-level grayscale voltage to an output circuit 157 via a voltage bus line 158.

A shift register circuit 153 included in a control circuit 152 of the drain driver 130 generates a data readout signal for an input register circuit 154 and outputs the data readout signal to the input register circuit 154, on the basis of the clock CL2 inputted from the display control device 110.

The input register circuit 154 latches display data of 6 bits for each color by the number of output lines in synchronism with the clock CL2 inputted from the display control device 110, on the basis of the data readout signal outputted from the shift register circuit 153.

A storage register circuit 155 latches the display data stored in the input register circuit 154, according to the clock CL1 inputted from the display control device 110.

The display data read into the storage register circuit 155 is inputted to the output circuit 157 via a level shift circuit 156.

The output circuit 157 selects one grayscale voltage level corresponding to the display data (one grayscale voltage level of 64 grayscale voltage levels), on the basis of the 64-level grayscale voltage, and outputs the selected grayscale voltage level each of the drain signal lines D.

Figure 15:
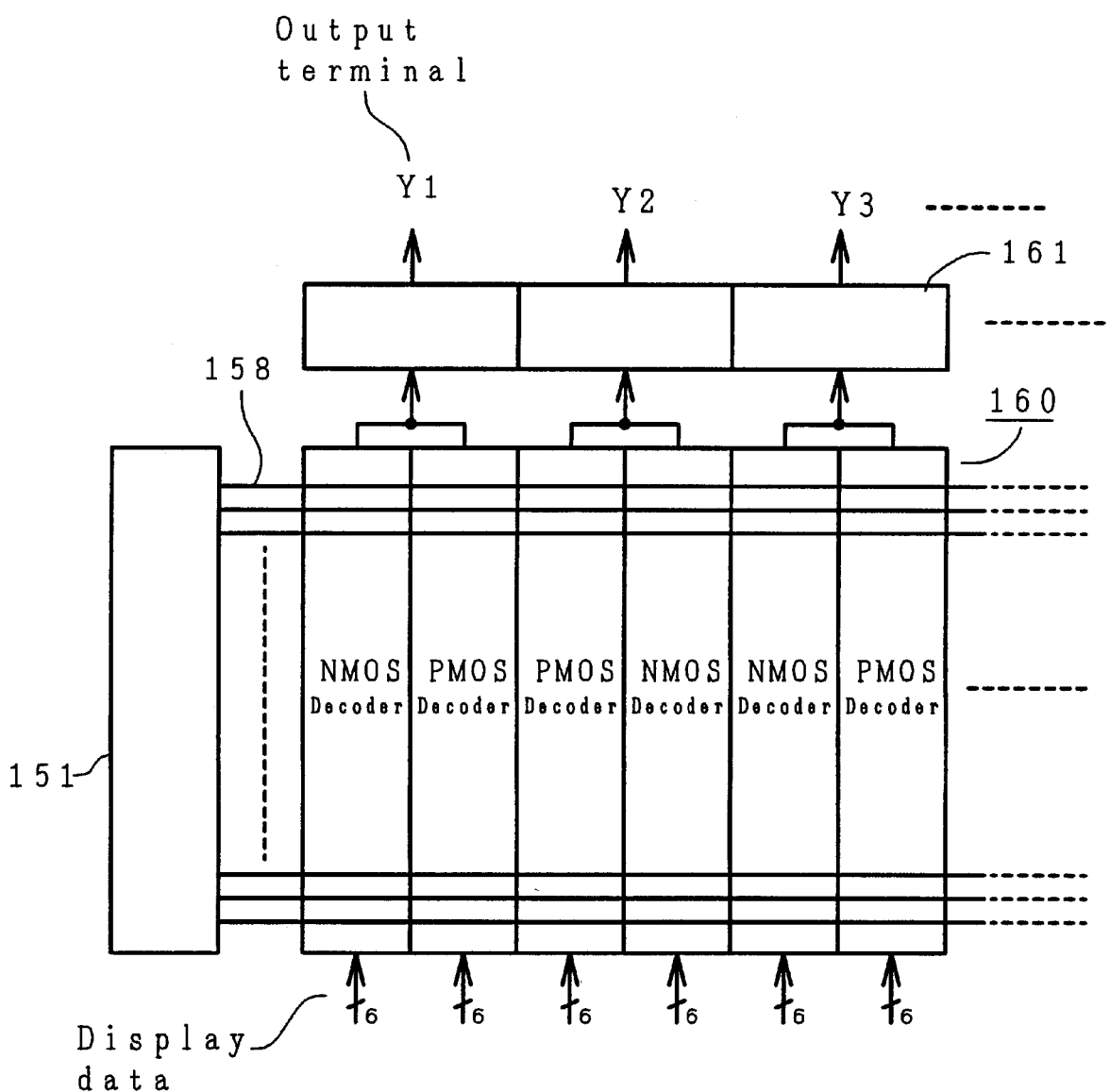
FIG. 15 is a block diagram schematically showing the construction of the output circuit shown in FIG. 14.

FIG. 15 is a block diagram schematically showing the construction of the output circuit 157 shown in FIG. 14.

As shown in FIG. 15, the output circuit 157 shown in FIG. 14 is made of a decoder circuit 160 and an output amplifier circuit 161.

Incidentally, in FIG. 15, the flow of signals is shown to be opposite to that in FIG. 14.

Figure 16:
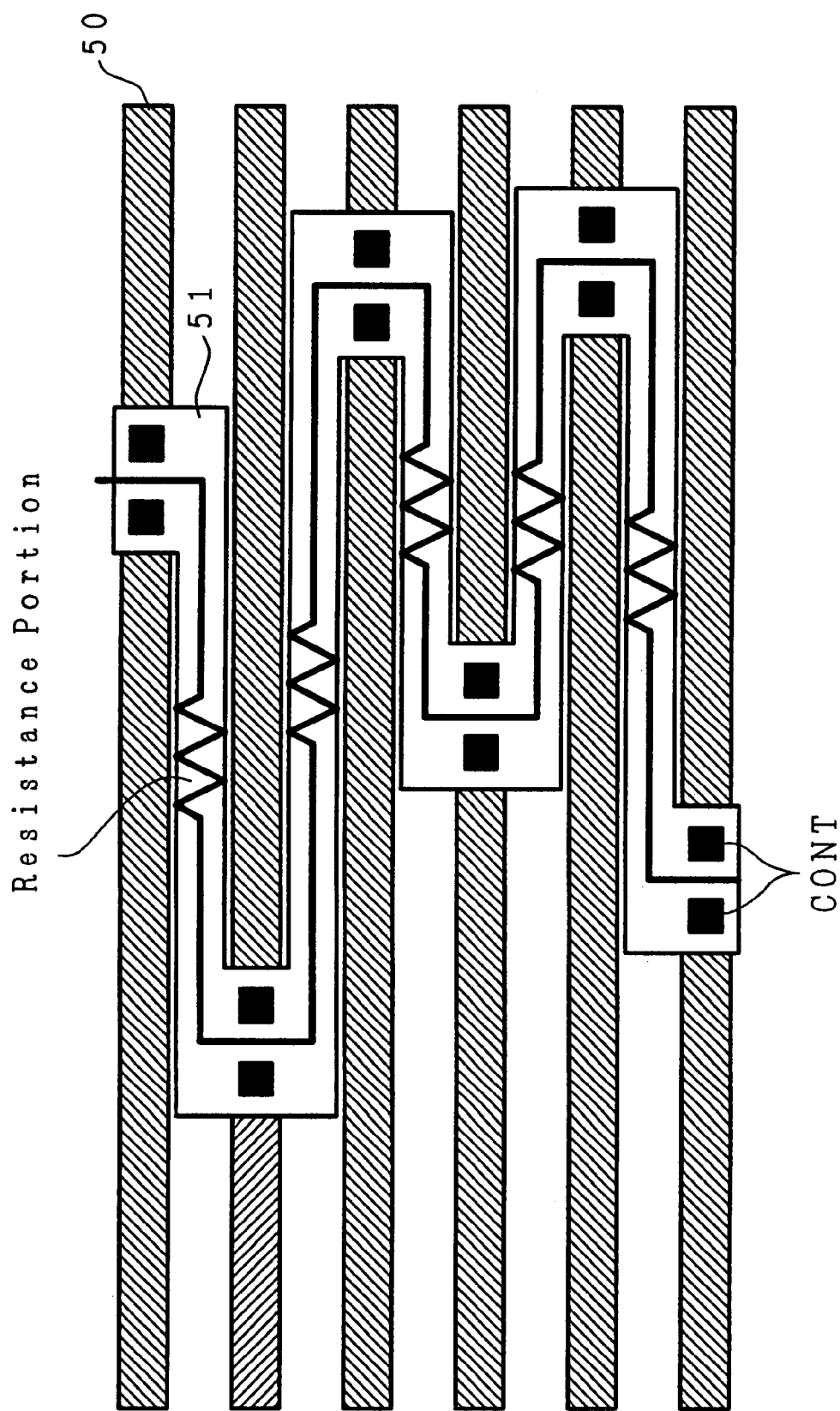
FIG. 16,is a plan view showing the internal layout of the semiconductor chip of the grayscale voltage generation circuit of a related-art drain driver.

FIG. 16 is a plan view showing the internal layout of the semiconductor chip of the grayscale voltage generation circuit 151 of the drain driver 130 according to a related art.

As shown in FIG. 16, the related-art grayscale voltage generation circuit 151 is made of a plurality of aluminum (hereinafter referred to simply as AL) lines 50 which constitute the voltage bus line 158, and poly-silicon (hereinafter referred to simply as poly-Si) resistance layer 51 which constitutes voltage dividing resistors for dividing the respective voltage ranges between the adjacent grayscale reference voltages.

Each of the AL lines 50 and the poly-Si resistance layer 51 are disposed with an interlayer insulation layer interposed therebetween.

The resistance value of each of the voltage dividing resistors is determined by the positions of connection holes CONT in the state in which each of the AL lines 50 and the poly-Si resistance layer 51 are arranged in parallel with each other and the pitch of the poly-Si resistance layer 51 is made equal to the pitch of the AL lines 50.

However, in the related-art grayscale voltage generation circuit 151, in case that the resistance value of the series resistance voltage dividing circuit is made small to reduce the charge/discharge time of each of the series resistance voltage dividing circuit and the decoder circuit 160, a charge or discharge current which flows through the series resistance voltage dividing circuit becomes large when the decoder circuit 160 of the output circuit 157 selects an arbitrary grayscale voltage level.

The poly-Si resistance layer 51 which constitutes the voltage dividing resistors has an allowable current value, and in case that the width of the poly-Si resistance layer 51 is small, there is the risk that the amount of current flowing through the poly-Si resistance layer 51 exceeds the allowable current value and the poly-Si resistance layer 51 melts.

In recent years, to meet a demand for liquid crystal display devices having narrower frames, it has been required to decrease the chip size of a semiconductor chip (IC) which constitutes the drain driver 130. In addition, to cope with multiple grayscale levels, the number of resistors into which to divide the poly-Si resistance layer 51 has been increased, and furthermore, the precision of the resistance value of each of the resistors needs to be increased, so that the setting of a resistance value is becoming important.

However, the related-art grayscale voltage generation circuit 151 requires a complicated and a long time operation if the resistance value of the poly-Si resistance layer 51 which constitutes the voltage dividing resistors is to be set or changed.

Moreover, the related-art grayscale voltage generation circuit 151 has the disadvantage that according to the manner of arrangement of the AL lines 50 and the poly-Si resistance layer 51, the AL lines 50 needs to be multilayered and, therefore, become unable to be disposed in the space of the poly-Si resistance layer 51, so that it becomes impossible to efficient by utilize such space.

Figure 17:
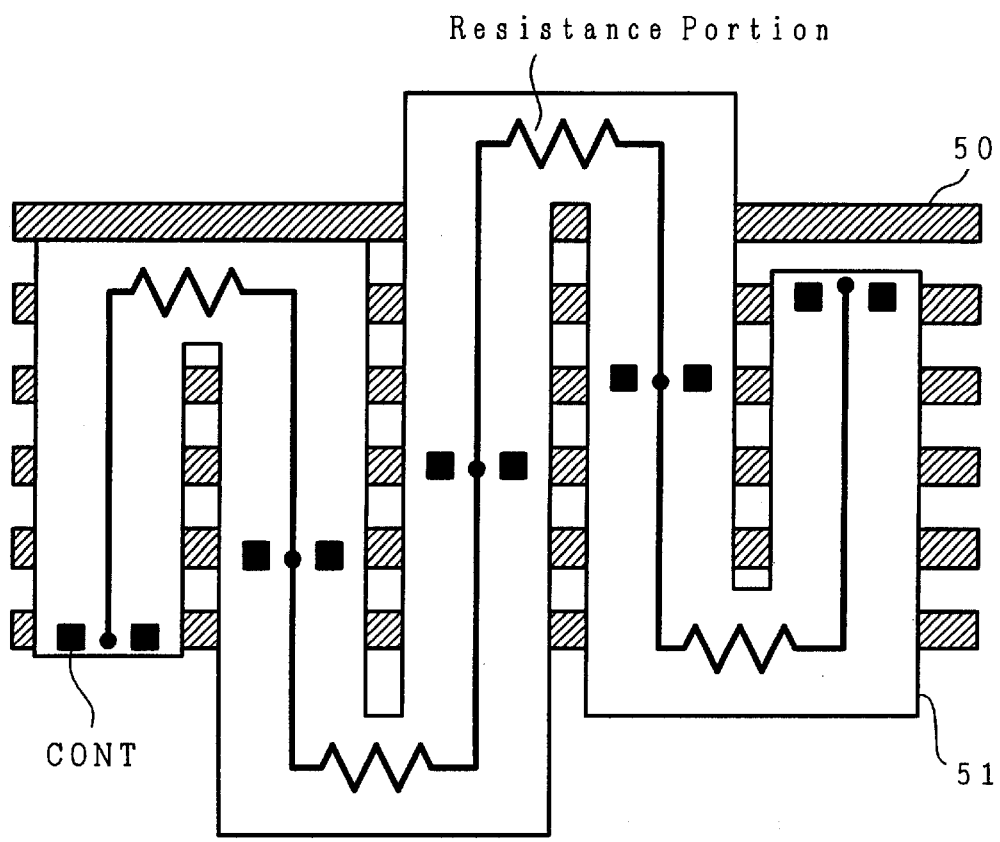
FIG. 17 is a plan view showing the internal layout of the semiconductor chip (IC) of the grayscale voltage generation circuit according to the embodiment.

FIG. 17 is a plan view showing the internal layout of the semiconductor chip (IC) of the grayscale voltage generation circuit 151 according to the embodiment.

Figure 18:
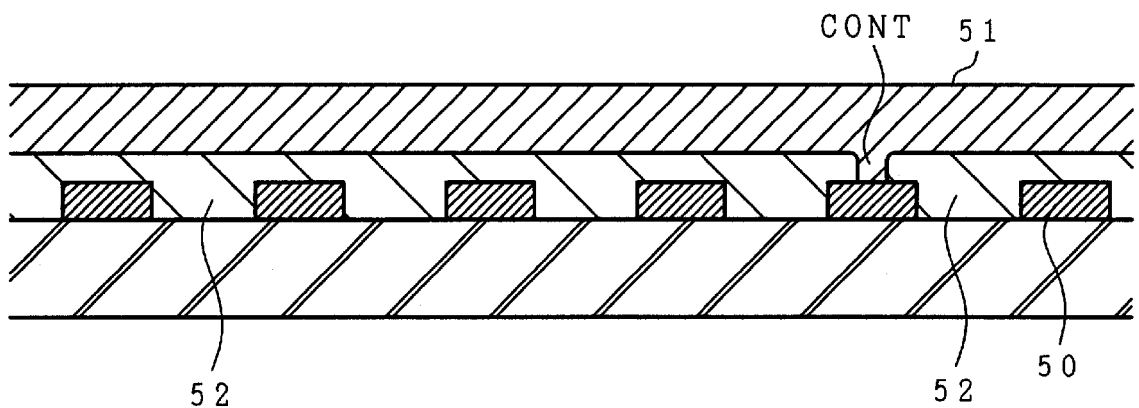
FIG. 18 is a cross-sectional view showing the cross-sectional structure of the essential internal portion of the semiconductor chip (IC) of the grayscale voltage generation circuit according to the embodiment.

FIG. 18 is a cross-sectional view showing the cross-sectional structure of the essential internal portion of the semiconductor chip (IC) of the grayscale voltage generation circuit 151 according to the embodiment.

In the grayscale voltage generation circuit 151 according to the embodiment, the poly-Si resistance layer 51 which is formed over an interlayer insulation layer 52 and constitutes the voltage dividing resistors is arranged approximately perpendicularly to the plurality of AL lines 50 which constitute the voltage bus line 158, and the AL lines 50 and the poly-Si resistance layer 51 are electrically connected by the connection holes CONT.

According to this construction, the width of the poly-Si resistance layer 51 can be determined independently of the pitch of the AL lines 50, whereby the poly-Si resistance layer 51 can be given an optimum width.

Although the entire poly-Si resistance layer 51 is seamlessly formed as one resistance layer, one folded portion is formed for each of the resistors so that each of the divided resistors functions as an independent resistor.

In this manner, according to the grayscale voltage generation circuit 151 of the embodiment, since the poly-Si resistance layer 51 is arranged perpendicularly to the AL lines 50, it is possible to determine an optimum width of the poly-Si resistance layer 51 according to the allowable current value of the poly-Si resistance layer 51 independently of the line pitch of the AL lines 50.

In addition, since the grayscale voltage generation circuit 151 can be realized with only two layers, i.e., the AL lines 50 and the poly-Si resistance layer 51, other layers can be effectively utilized as layers other than the poly-Si resistance layer 51.

Moreover, although the entire poly-Si resistance layer 51 is seamlessly formed as one resistor, each of the divided resistors can be set independently, and furthermore, the grayscale voltage generation circuit 151 can be realized with only two layers, i.e., the AL lines 50 and the poly-Si resistance layer 51, whereby the resistance value of each of the divided resistors can be easily modified or changed.

Figure 19:
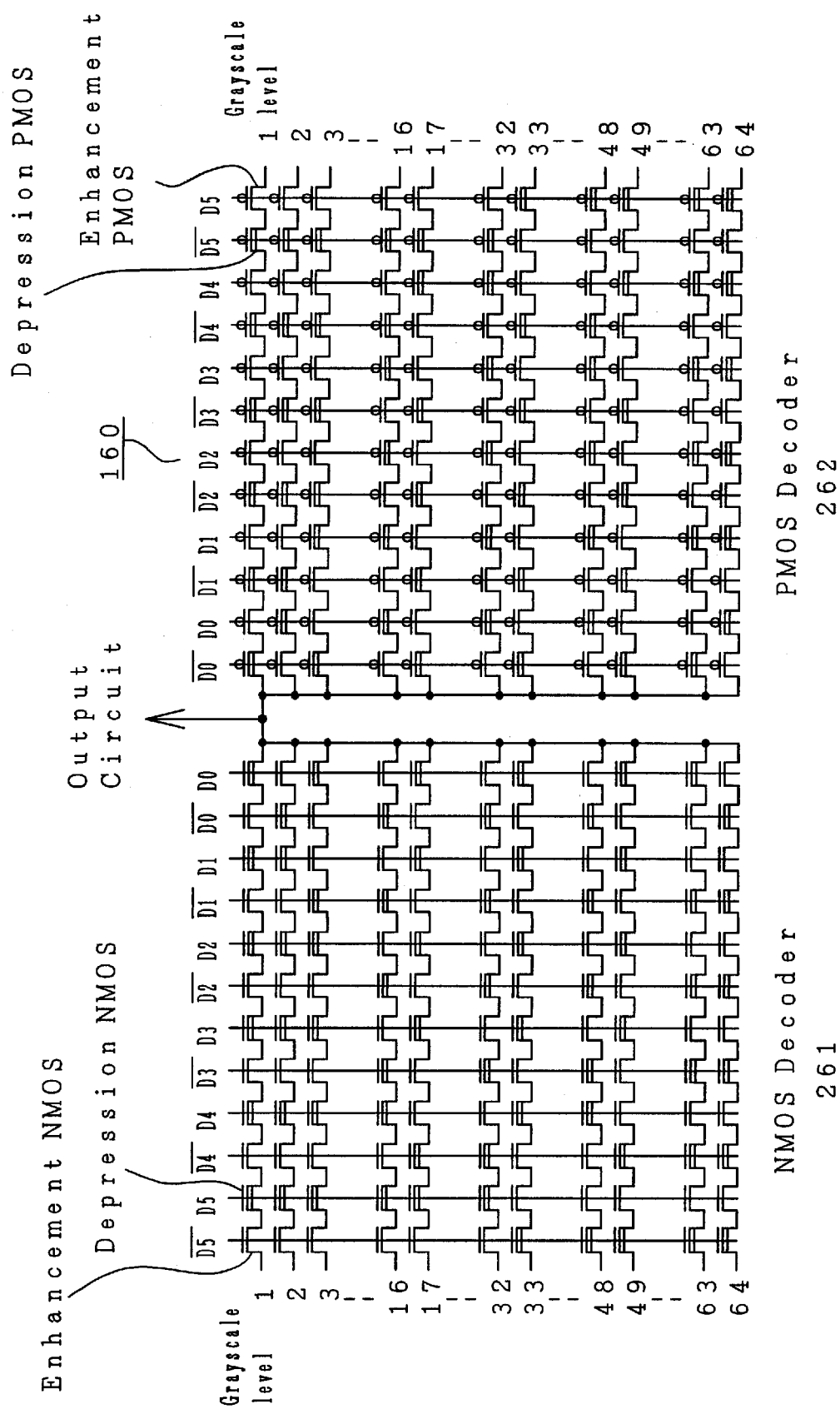
FIG. 19 is a view showing the construction of the decoder circuit of the related-art drain driver.

FIG. 19 is a view showing the construction of the decoder circuit 160 of the related-art drain driver 130.

The decoder circuit 160 shown in FIG. 19 is a complementary decoder made of an NMOS decoder 261 and a PMOS decoder 262, and the output of the decoder circuit 160 is inputted to the output amplifier circuit 161 which corresponds to one output terminal connected to the corresponding drain terminal D.

The NMOS decoder 261 includes transistor trains each formed by a series connection of six enhancement N channel MOS transistors (hereinafter referred to simply as NMOSTr and six depression NMOSTr. The PMOS decoder 262 includes transistor trains each formed by a series connection of six enhancement P channel MOS transistors (hereinafter referred to simply as PMOSTr and six depression PMOSTr.

Each of the NMOS decoder 261 and the PMOS decoder 262 has sixty-four transistor trains, and the 64-level grayscale voltage outputted from the voltage bus line 158 is inputted to one end of each of the transistor trains.

The non-inverted data (D0, D1, ) or the inverted data (/D0, /D1, ) of each bit of display data is applied to the gate electrode of each of the MOSTr of each of the transistor trains on the basis of a predetermined combination, and one grayscale voltage level is selected from the 64-level grayscale voltage.

For example, referring to the decoding table attached hereto as Table 1, each of the MOS transistors (hereinafter referred to simply as of the NMOS decoder 261 to which non-inverted data is to be applied is made of a depression NMOSTr which produces display data of "0" when non-inverted data is applied thereto, or an enhancement NMOS transistor which produces display data of "1" when non-inverted data is applied thereto. Regarding the MOSTr of the NMOS decoder 261 to which inverted data are to be applied, the combination of the type of NMOSTr and the value of display data is reversed from the above-described one.

Each of the MOS transistors of the PMOS decoder 262 to which non-inverted data is to be applied is made of an enhancement PMOSTr which produces display data of "0" when non-inverted data is applied thereto, or a depression PMOS transistor which produces display data of "1" when non-inverted data is applied thereto. Regarding the MOSTr of the PMOS decoder 262 to which inverted data are to be applied, the combination of the type of PMOSTr and the value of display data is reversed from the above-described one.

TABLE 1

| Grayscale level | Display data | | | | | |
|---|---|---|---|---|---|---|
| | D5 | D4 | D3 | D2 | D1 | D0 |
| 1 | 0 | 0 | 0 | 0 | 0 | 0 |
| 2 | 0 | 0 | 0 | 0 | 0 | 1 |
| 3 | 0 | 0 | 0 | 0 | 1 | 0 |
| 4 | 0 | 0 | 0 | 0 | 1 | 1 |
| 5 | 0 | 0 | 0 | 1 | 0 | 0 |
| 6 | 0 | 0 | 0 | 1 | 0 | 1 |
| 7 | 0 | 0 | 0 | 1 | 1 | 0 |
| 8 | 0 | 0 | 0 | 1 | 1 | 1 |
| 9 | 0 | 0 | 1 | 0 | 0 | 0 |
| 10 | 0 | 0 | 1 | 0 | 0 | 1 |
| 11 | 0 | 0 | 1 | 0 | 1 | 0 |
| 12 | 0 | 0 | 1 | 0 | 1 | 1 |
| 13 | 0 | 0 | 1 | 1 | 0 | 0 |
| 14 | 0 | 0 | 1 | 1 | 0 | 1 |
| 15 | 0 | 0 | 1 | 1 | 1 | 0 |
| 16 | 0 | 0 | 1 | 1 | 1 | 1 |
| 17 | 0 | 1 | 0 | 0 | 0 | 0 |
| 18 | 0 | 1 | 0 | 0 | 0 | 1 |
| 19 | 0 | 1 | 0 | 0 | 1 | 0 |
| 20 | 0 | 1 | 0 | 0 | 1 | 1 |
| 21 | 0 | 1 | 0 | 1 | 0 | 0 |
| 22 | 0 | 1 | 0 | 1 | 0 | 1 |
| 23 | 0 | 1 | 0 | 1 | 1 | 0 |
| 24 | 0 | 1 | 0 | 1 | 1 | 1 |
| 25 | 0 | 1 | 1 | 0 | 0 | 0 |
| 26 | 0 | 1 | 1 | 0 | 0 | 1 |
| 27 | 0 | 1 | 1 | 0 | 1 | 0 |
| 28 | 0 | 1 | 1 | 0 | 1 | 1 |
| 29 | 0 | 1 | 1 | 1 | 0 | 0 |
| 30 | 0 | 1 | 1 | 1 | 0 | 1 |
| 31 | 0 | 1 | 1 | 1 | 1 | 0 |
| 32 | 0 | 1 | 1 | 1 | 1 | 1 |
| 33 | 1 | 0 | 0 | 0 | 0 | 0 |
| 34 | 1 | 0 | 0 | 0 | 0 | 1 |
| 35 | 1 | 0 | 0 | 0 | 1 | 0 |
| 36 | 1 | 0 | 0 | 0 | 1 | 1 |
| 37 | 1 | 0 | 0 | 1 | 0 | 0 |
| 38 | 1 | 0 | 0 | 1 | 0 | 1 |
| 39 | 1 | 0 | 0 | 1 | 1 | 0 |
| 40 | 1 | 0 | 0 | 1 | 1 | 1 |
| 41 | 1 | 0 | 1 | 0 | 0 | 0 |
| 42 | 1 | 0 | 1 | 0 | 0 | 1 |
| 43 | 1 | 0 | 1 | 0 | 1 | 0 |
| 44 | 1 | 0 | 1 | 0 | 1 | 1 |
| 45 | 1 | 0 | 1 | 1 | 0 | 0 |
| 46 | 1 | 0 | 1 | 1 | 0 | 1 |
| 47 | 1 | 0 | 1 | 1 | 1 | 0 |
| 48 | 1 | 0 | 1 | 1 | 1 | 1 |
| 49 | 1 | 1 | 0 | 0 | 0 | 0 |
| 50 | 1 | 1 | 0 | 0 | 0 | 1 |
| 51 | 1 | 1 | 0 | 0 | 1 | 0 |
| 52 | 1 | 1 | 0 | 0 | 1 | 1 |
| 53 | 1 | 1 | 0 | 1 | 0 | 0 |
| 54 | 1 | 1 | 0 | 1 | 0 | 1 |
| 55 | 1 | 1 | 0 | 1 | 1 | 0 |
| 56 | 1 | 1 | 0 | 1 | 1 | 1 |
| 57 | 1 | 1 | 1 | 0 | 0 | 0 |
| 58 | 1 | 1 | 1 | 0 | 0 | 1 |
| 59 | 1 | 1 | 1 | 0 | 1 | 0 |
| 60 | 1 | 1 | 1 | 0 | 1 | 1 |
| 61 | 1 | 1 | 1 | 1 | 0 | 0 |
| 62 | 1 | 1 | 1 | 1 | 0 | 1 |
| 63 | 1 | 1 | 1 | 1 | 1 | 0 |
| 64 | 1 | 1 | 1 | 1 | 1 | 1 |

In recent years, the trend in liquid crystal display devices has been toward larger screen sizes and higher resolution of definition, and the number of output terminals of the drain driver 130 used in such a liquid crystal display device have been increasing. Since the decoder circuit 160 and the output amplifier circuit 161 are needed for each of the output terminals, the chip size of the semiconductor chip (IC) increases with an increase in the number of output terminals.

Moreover, in the related-art decoder circuit 160 shown in FIG. 19, since twelve NMOS and PMOS transistors are connected in series in each transistor train, the on-resistance of the decoder circuit 160 at the time of the selection of a grayscale voltage level becomes large, and in addition, it is impossible to avoid the influence of increased screen size or increased resolution of definition upon the speed of operation or image quality.

Figure 20:
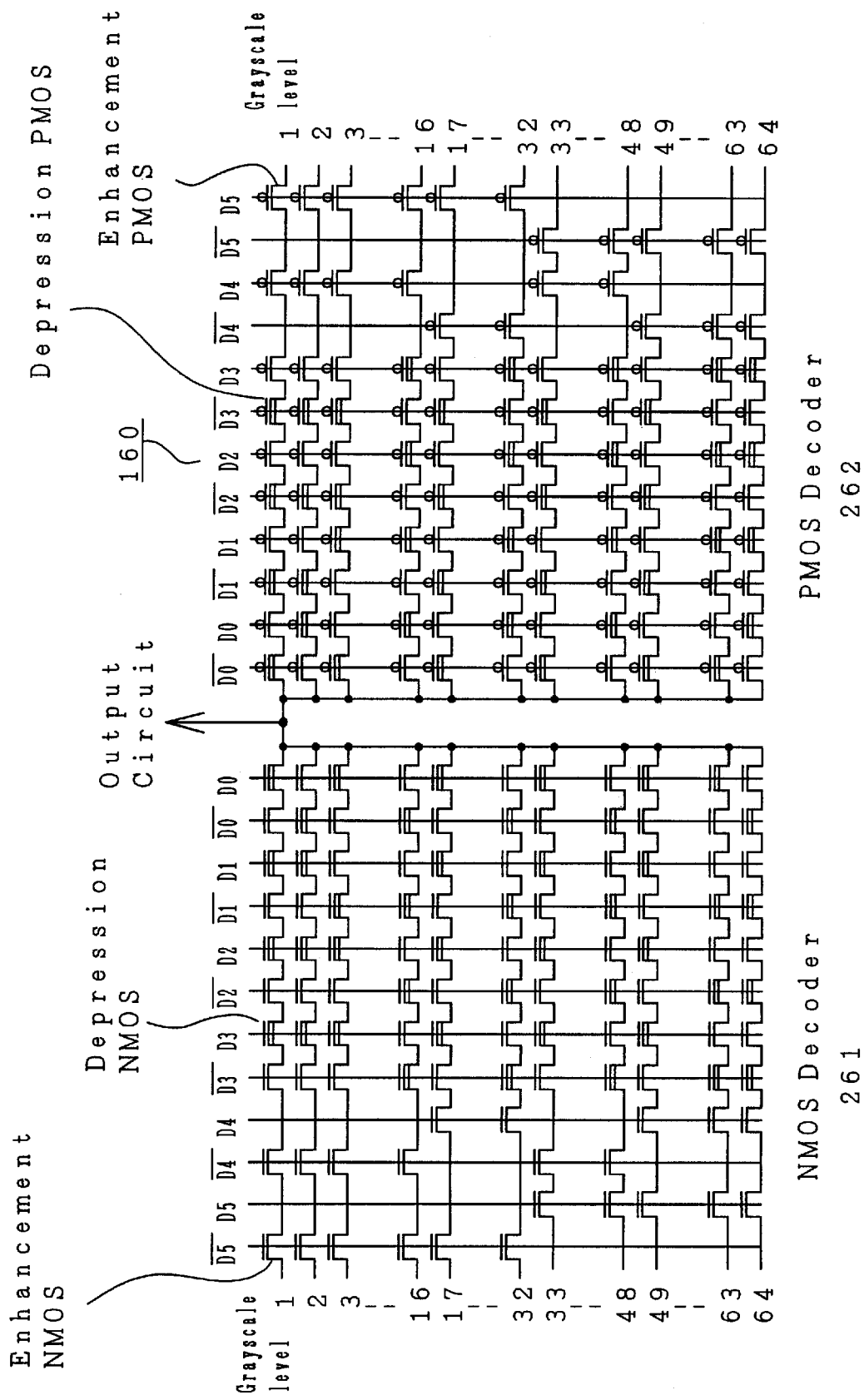
FIG. 20 is a view showing the construction of the decoder circuit of the drain driver according to the embodiment.

FIG. 20 is a view showing the construction of the decoder circuit 160 of the drain driver 130 according to the embodiment.

In the 6-bit decoder circuit 160 according to the embodiment, each high-order bit (D5 and d4) is formed by one enhancement MOSTr, while each lower-order bit is formed by a combination of two enhancement and depression MOSTr according to non-inverted data (D3, D2, D1 and D0) and inverted data (/D3, /D2, /D1 and /D0).

Referring to the decoding table attached hereto as Table 1, the display data of the most significant bit D5 changes from "0" to "1" between a grayscale level 32 to a grayscale level 33, and the display data of the second most significant bit D4 changes from "0" to "1" between a grayscale level 16 to a grayscale level 17, from "1" to "0" between the grayscale level 32 to the grayscale level 33, and from "0" to "1" between a grayscale level 48 to a grayscale level 49.

In the NMOS decoder 261, the level of display data is switched at each point of switchover of the display data so that when the display data is "1", non-inverted data is applied to the gate electrodes of the MOSTr which control the respective high-order bits (D5 and D4), and when the display data is "0", inverted data is applied to the same. In the PMOS decoder 262, display data is applied in the reverse manner. Accordingly, each of the high-order bits (D5 and D4) can be realized by one enhancement PMOSTr or NMOSTr.

In this manner, in the complementary decoder, four MOSTr can be omitted per one grayscale level, and if a similar method is applied to the bit D3, a total of six MOSTr can be omitted.

Figure 21:
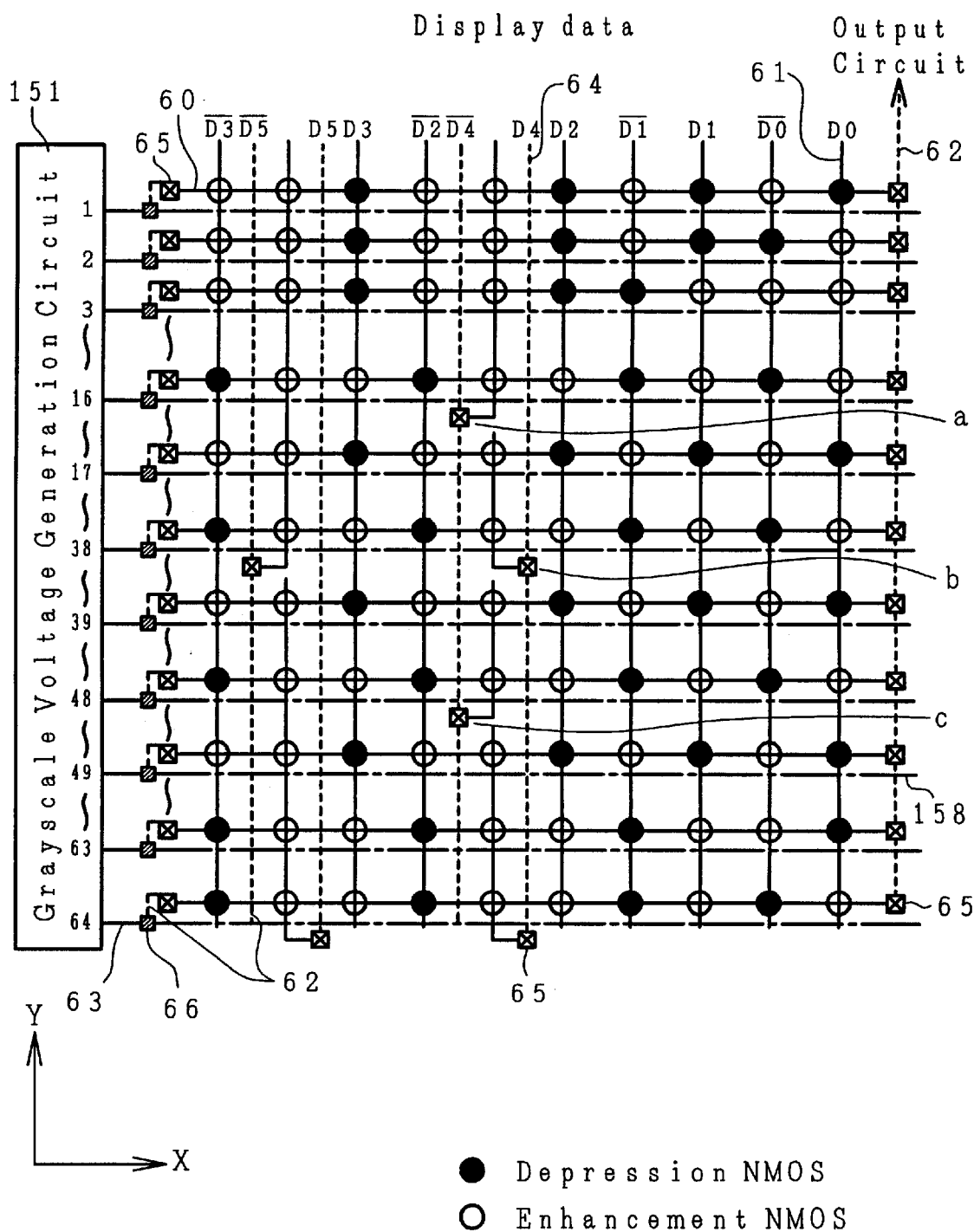
FIG. 21 is a conceptual diagram illustrating the internal layout of the decoder circuit shown in FIG. 20, of the semiconductor chip (IC)

FIG. 21 is a conceptual diagram illustrating the internal layout of the decoder circuit 160 (shown in FIG. 20) of the semiconductor chip (IC).

Incidentally, FIG. 21 shows the internal layout of the NMOS decoder 261.

As shown in FIG. 21, a total of ten enhancement and depression NMOSTr are formed by each of sixty-four N-type diffusion layers 60 and each of ten poly-Si gate electrodes 61 which are arranged perpendicularly to the N-type diffusion layers 60 and at approximately equal intervals.

One end of each of the N-type diffusion layers 60 is connected to a first-layer AL line 62 by a connection hole 65 so that a decoder output is obtained, and the other end is connected to the voltage bus line 158 formed by a second-layer AL line 63, by a connection hole 65, the first-layer AL line 62 and a connection hole 66.

Each of the gate electrodes for the lower-order bits (D0 to D3) is formed as one continuous data bus, and intersects sixty-four N-type diffusion layers 60 to form the MOSTr. Data buses 64 for non-inverted data and inverted data are formed by the first-layer AL line 62, and each of the gate electrodes for the higher-order bits (D5 and D4) is connected to the adjacent ones of the non-inverted and inverted data buses 64 by connection holes 65 in such a manner that each of the gate electrodes is switched from either of the non-inverted and inverted data buses 64 to the other at each point of switchover of the data.

In this manner, by arranging only three contact regions a, b and c in the Y direction as viewed in FIG. 21, it is possible to realize the NMOS decoder 261 by using ten MOSTr unlike the related-art NMOS decoder 261 which requires twelve MOSTr, whereby it is possible to reduce the layout area of the decoder circuit 160.

In this manner, it is possible to reduce the length of the semiconductor chip (IC) in the X direction (the X direction as viewed in FIG. 6).

It is apparent that the layout area of the semiconductor chip (IC) in the X direction can be reduced to a further extent by increasing the number of bits which integrate MOSTr, as by adding the bits D3 and D2. However, since the number of contact regions for switchover between gate electrodes must be increased and the length of the semiconductor chip (IC) in the Y direction must also be increased, it is necessary to optimize the number of MOSTr-integrating bits to be increased, by taking account of the lengths of the semiconductor chip (IC) in both of the X and Y directions.

In this manner, according to the decoder circuit 160 of the embodiment, since the number of transistors connected in series in the complementary decoder circuit 160 can be decreased, the layout area of the decoder circuit 160 per one output can be made small so that the chip size can be made comparatively small even in the case of multiple outputs.

In addition, since the number of transistors connected in series in the complementary decoder circuit 160 can be decreased, the on-resistance of the decoder circuit 160 can be made small and the output voltage of the decoder circuit 160 can be made to reach a stable voltage level in a short time.

Figure 22:
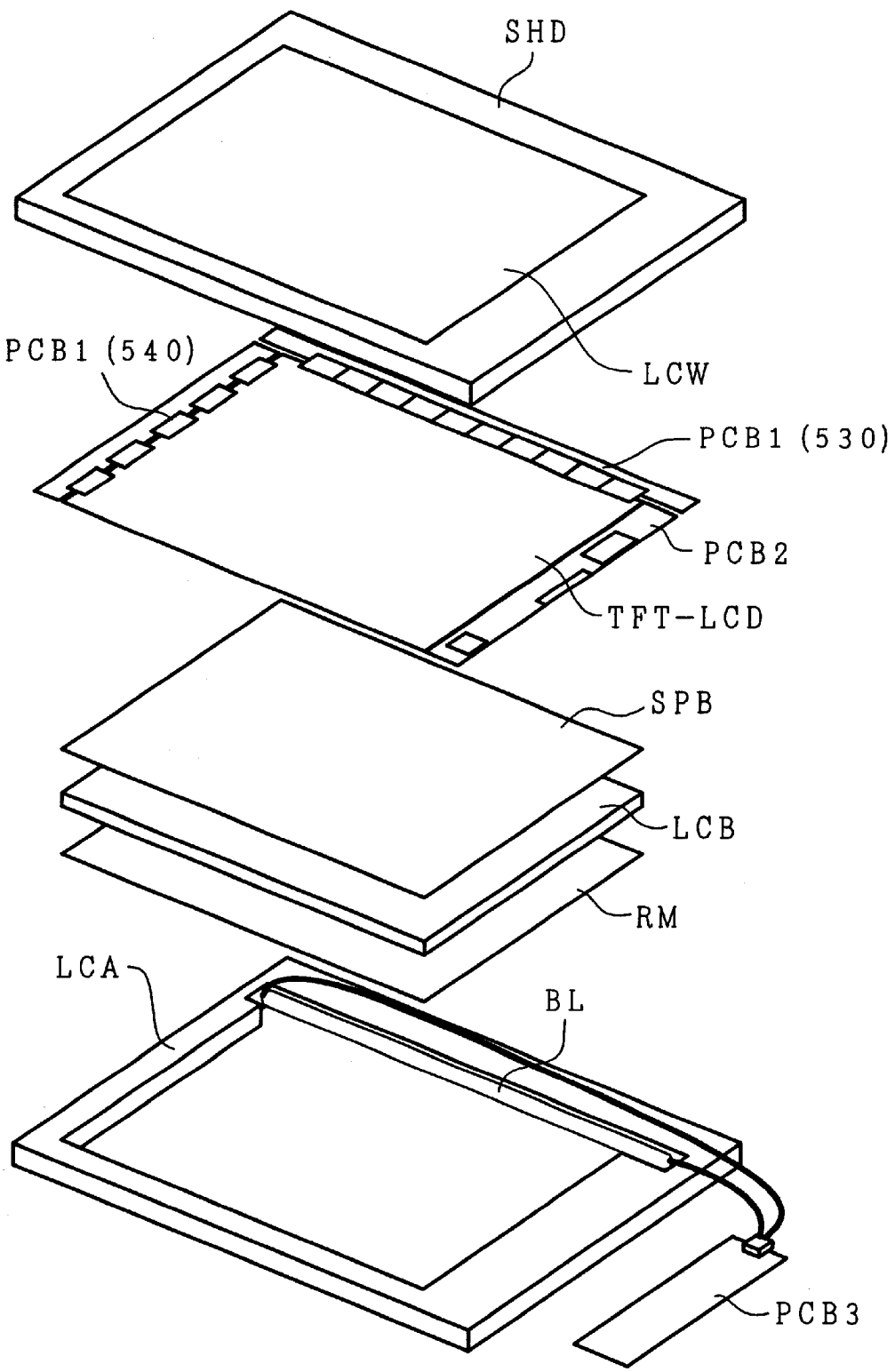
FIG. 22 is an exploded perspective view of constituent components of one example of a TFT type of liquid crystal display module according to the embodiment.

FIG. 22 is an exploded perspective view of constituent components of one example of a TFT type of liquid crystal display module according to the embodiment.

In FIG. 22, symbol SHD denotes a frame-shaped shield case made from a metal plate, symbol LCW a display window of the shield case CHD; symbol SPB an optical diffusion sheet; symbol LCB a light guide body; symbol RM a reflecting sheet; symbol BL a back light; and symbol LCA a lower case (a back light case).

Driving circuit boards PCB1 and PCB2 are mounted on the periphery of the liquid crystal display panel TFT-LCD.

The respective driving circuit boards PCB1 and PCB2 are disposed along different sides of the liquid crystal display panel TFT-LCD, and are electrically connected by a flat cable (not shown).

Electronic components such as tape carrier packages (TCPs) and capacitors are mounted on the driving circuit board PCB1, and the driving circuit board PCB1 is divided into a driving circuit board for drain drivers 530 and a driving circuit board for gate drivers 540.

Electronic components such as semiconductor circuits (IC), capacitors and resistors are mounted on the driving circuit board PCB2, and the driving circuit board PCB2 constitutes the interface block 100 shown in FIG. 1.

The shield case SHD, the liquid crystal display panel TFT-LCD on the periphery of which the driving circuit boards PCB1 and PCB2 are mounted, the optical diffusion sheet SPB, the light guide body LCB, the reflecting sheet RM, the back light fluorescent tube BL and the back light case LCA are stacked in the shown arrangement to assemble the liquid crystal display module according to the embodiment.

The liquid crystal display module according to the embodiment is constructed so that all the members are fixed by claws and hooks disposed on the shield case SHD.

The back light case LCA has a shape which accommodates the back light fluorescent tube BL, the optical diffusion sheet SPB, the light guide body LCB and the reflecting sheet RM. Light of the back light fluorescent tube BL which is disposed on one side of the light guide body LCB is formed into back light which becomes uniform on the display screen, by the light guide body LCB, the reflecting sheet RM and the optical diffusion sheet SPB, and the back light is made to exit toward the liquid crystal display panel TFT-LCD.

An inverter circuit board PCB3 is connected to the back light fluorescent tube BL as the power source thereof.

Illuminating light from the back light fluorescent tube BL is radiated from the liquid crystal display panel TFT-LCD through a polarizer disposed on the side of the back light, a liquid crystal LC sealed between a pair of glass substrates and an obverse-side polarizer.

The area of the display window LCW of the shield case SHD constitutes the display area of the liquid crystal display module, and the area other than the display area of the liquid crystal display module, i.e., the area of the shield case SHD which surrounds the display area, is usually called a frame.

Although the invention made by the present inventor has been specifically described above with reference to the embodiment, it is a matter of course that the invention is not limited to the above-described embodiment and various modifications can be made without departing from the scope of the invention.

The representative advantages of the invention disclosed in the present application will be described below in brief.

(1) in accordance with the invention, it is possible to reduce the chip size of a semiconductor chip in a video signal line driving unit.

(2) in accordance with the invention, it is possible to realize liquid crystal display devices having far narrower frames and far lower prices.

What is claimed is:

1. A liquid crystal display device comprising:
a liquid crystal display panel having a plurality of pixels arranged in matrix form; and
a video signal line driving unit for supplying a video signal voltage to each of the pixels,
the video signal line driving unit including at least one semiconductor chip, the at least one semiconductor chip including:
a plurality of bump electrodes;
a plurality of protective diode pairs each including a first diode and a second diode; and
a plurality of interconnect layers disposed to cover an anode region of the first diode and a cathode region of the second diode of each of the protective diode pairs and connected to the anode region of the first diode and the cathode region of the second diode, the plurality of interconnect layers having connection portions for connection to the respective bump electrodes,
each of the interconnect layers which overlie the anode region of the first diode and the cathode region of the second diode of each of the protective diode pairs having the same shape,
at least one of the plurality of bump electrodes being disposed over the anode region of the first diode or the cathode region of the second diode of one of the protective diode pairs and being connected to a corresponding one of the connection portions of the interconnect layers over the anode region of the first diode or the cathode region of the second diode of the one of the protective diode pairs.

2. A liquid crystal display device according to claim 1, further comprising an insulation layer which is formed over the interconnect layers and has an opening over the anode region of the first diode or the cathode region of the second diode of each of the protective diode pairs,
at least one of the plurality of bump electrodes being formed over the opening and the insulation layer in a peripheral portion of the opening and being connected to the corresponding one of the connection portions of the interconnect layers by the opening.

3. A liquid crystal display device according to claim 1, wherein one of two adjacent bump electrodes of the plurality of bump electrodes is disposed over the anode region of the first diode of each of the protective diode pairs, and the other is disposed over the cathode region of the second diode of each of the protective diode pairs.

4. A liquid crystal display device according to claim 1, further comprising n number of conductive layers which are connected to one another and are disposed between the interconnect layers and the anode region of the first diode and the cathode region of the second diode of each of the protective diode pairs in such a manner that an interlayer insulation layer is interposed between each of the n number of conductive layers and interlayer insulation layers are interposed both between the n number of conductive layers and the anode and cathode regions and between the n number of conductive layers and the interconnect layers, the n-th one of the conductive layers being connected to the interconnect layers,
the first one of the conductive layers being connected to the anode region of the first diode and the cathode region of the second diode of each of the protective diode pairs by a plurality of connection holes formed in the interlayer insulation layer.

5. A liquid crystal display device according to claim 1, further comprising n number of conductive layers which are connected to one another and are disposed between the interconnect layers and the anode region of the first diode and the cathode region of the second diode of each of the protective diode pairs in such a manner that an interlayer insulation layer is interposed between each of the n number of conductive layers and interlayer insulation layers are interposed both between the n number of conductive layers and the anode and cathode regions and between the n number of conductive layers and the interconnect layers, the first one of the conductive layers being connected to the anode region of the first diode and the cathode region of the second diode of each of the protective diode pairs,
the first to the n-th conductive layers being connected to one another by a plurality of connection holes formed in the interlayer insulation layer,
the n-th conductive layer being connected to the interconnect layers by a plurality of connection holes formed in the interlayer insulation layer.

6. A liquid crystal display device according to claim 1, further comprising n number of conductive layers which are connected to one another and are disposed between the interconnect layers and the anode region of the first diode and the cathode region of the second diode of each of the protective diode pairs in such a manner that an interlayer insulation layer is interposed between each of the n number of conductive layers and interlayer insulation layers are interposed both between the n number of conductive layers and the anode and cathode regions and between the n number of conductive layers and the interconnect layers,
the first one of the conductive layers being connected to the anode region of the first diode and the cathode region of the second diode by a plurality of first connection holes formed in the interlayer insulation layer in a first area over the anode region of the first diode and the cathode region of the second diode of each of the protective diode pairs,
the first to the n-th conductive layers being connected to one another by a plurality of second connection holes formed in the interlayer insulation layer outside the first area over the anode region of the first diode and the cathode region of the second diode of each of the protective diode pairs,
the n-th conductive layer being connected to the interconnect layers by a plurality of third connection holes formed in the interlayer insulation layer outside the first area over the anode region of the first diode and the cathode region of the second diode of each of the protective diode pairs.

7. A liquid crystal display device according to claim 1, further comprising a conductive layer which is disposed between the interconnect layers and the anode region of the first diode and the cathode region of the second diode of each of the protective diode pairs in such a manner that interlayer insulation layers are interposed both between the conductive layer and the anode and cathode regions and between the conductive layer and the interconnect layers, the conductive layer being connected to the anode region of the first diode and the cathode region of the second diode by a plurality of first connection holes formed in the interlayer insulation layer in a first area over the anode region of the first diode and the cathode region of the second diode of each of the protective diode pairs, the conductive layer being also connected to the interconnect layers by a plurality of second connection holes formed in the interlayer insulation layer outside the first area over the anode region of the first diode and the cathode region of the second diode of each of the protective diode pairs.

8. A liquid crystal display device comprising:

a liquid crystal display panel having a plurality of pixels arranged in matrix form; and a video signal line driving unit for supplying a video signal voltage to each of the pixels, the video signal line driving unit including at least one semiconductor chip, the at least one semiconductor chip including:
 a plurality of bump electrodes;
 a plurality of protective diode pairs each including a first diode and a second diode; and
 a plurality of interconnect layers disposed to cover an anode region of the first diode and a cathode region of the second diode of each of the protective diode pairs and connected to the anode region of the first diode and the cathode region of the second diode, the plurality of interconnect layers having connection portions for connection to the respective bump electrodes,
 each of the interconnect layers which overlie the anode region of the first diode and the cathode region of the second diode of each of the protective diode pairs being formed to be wider than the anode region of the first diode and the cathode region of the second diode;
 at least one of the plurality of bump electrodes being disposed over the anode region of the first diode or the cathode region of the second diode of one of the protective diode pairs and being connected to a corresponding one of the connection portions of the interconnect layers over the anode region of the first diode or the cathode region of the second diode of the one of the protective diode pairs.

9. A liquid crystal display device according to claim 8, further comprising an insulation layer which is formed over the interconnect layers and has an opening over the anode region of the first diode or the cathode region of the second diode of each of the protective diode pairs, at least one of the plurality of bump electrodes being formed over the opening and the insulation layer in a peripheral portion of the opening and being connected to the corresponding one of the connection portions of the interconnect layers by the opening.

10. A liquid crystal display device according to claim 8, wherein one of two adjacent bump electrodes of the plurality of bump electrodes is disposed over the anode region of the first diode of each of the protective diode pairs, and the other is disposed over the cathode region of the second diode of each of the protective diode pairs.

11. A liquid crystal display device according to claim 8, further comprising n number of conductive layers which are connected to one another and are disposed between the interconnect layers and the anode region of the first diode and the cathode region of the second diode of each of the protective diode pairs in such a manner that an interlayer insulation layer is interposed between each of the n number of conductive layers and interlayer insulation layers are interposed both between the n number of conductive layers and the anode and cathode regions and between the n number of conductive layers and the interconnect layers, the n-th one of the conductive layers being connected to the interconnect layers, the first one of the conductive layers being connected to the anode region of the first diode and the cathode region of the second diode of each of the protective diode pairs by a plurality of connection holes formed in the interlayer insulation layer.

12. A liquid crystal display device according to claim 8, further comprising n number of conductive layers which are connected to one another and are disposed between the interconnect layers and the anode region of the first diode and the cathode region of the second diode of each of the protective diode pairs in such a manner that an interlayer insulation layer is interposed between each of the n number of conductive layers and interlayer insulation layers are interposed both between the n number of conductive layers and the anode and cathode regions and between the n number of conductive layers and the interconnect layers, the first one of the conductive layers being connected to the anode region of the first diode and the cathode region of the second diode of each of the protective diode pairs, the first to the n-th conductive layers being connected to one another by a plurality of connection holes formed in the interlayer insulation layer, the n-th conductive layer being connected to the interconnect layers by a plurality of connection holes formed in the interlayer insulation layer.

13. A liquid crystal display device according to claim 8, further comprising n number of conductive layers which are connected to one another and are disposed between the interconnect layers and the anode region of the first diode and the cathode region of the second diode of each of the protective diode pairs in such a manner that an interlayer insulation layer is interposed between each of the n number of conductive layers and interlayer insulation layers are interposed both between the n number of conductive layers and the anode and cathode regions and between the n number of conductive layers and the interconnect layers, the first one of the conductive layers being connected to the anode region of the first diode and the cathode region of the second diode by a plurality of first connection holes formed in the interlayer insulation layer in a first area over the anode region of the first diode and the cathode region of the second diode of each of the protective diode pairs, the first to the n-th conductive layers being connected to one another by a plurality of second connection holes formed in the interlayer insulation layer outside the first area over the anode region of the first diode and the cathode region of the second diode of each of the protective diode pairs, the n-th conductive layer being connected to the interconnect layers by a plurality of third connection holes formed in the interlayer insulation layer outside the first area over the anode region of the first diode and the cathode region of the second diode of each of the protective diode pairs.

14. A liquid crystal display device according to claim 8, further comprising a conductive layer which is disposed between the interconnect layers and the anode region of the first diode and the cathode region of the second diode of each of the protective diode pairs in such a manner that interlayer insulation layers are interposed both between the conductive layer and the anode and cathode regions and between the conductive layer and the interconnect layers, the conductive layer being connected to the anode region of the first diode and the cathode region of the second diode by a plurality of first connection holes formed in the interlayer insulation layer in a first area over the anode region of the first diode and the cathode region of the second diode of each of the protective diode pairs, the conductive layer being also connected to the interconnect layers by a plurality of second connection holes formed in the interlayer insulation layer outside the first area over the anode region of the first diode and the cathode region of the second diode of each of the protective diode pairs.

* * * * *